United States Patent
Suzuki

(10) Patent No.: US 10,432,156 B2
(45) Date of Patent: Oct. 1, 2019

(54) SEMICONDUCTOR DEVICE

(71) Applicant: Renesas Electronics Corporation, Tokyo (JP)

(72) Inventor: Yasufumi Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/988,016

(22) Filed: May 24, 2018

(65) Prior Publication Data

US 2019/0007014 A1 Jan. 3, 2019

(30) Foreign Application Priority Data

Jun. 30, 2017 (JP) .................................. 2017-129068

(51) Int. Cl.
| | | |
|---|---|---|
| H03F 3/45 | (2006.01) |
| H03F 3/72 | (2006.01) |
| H03F 1/52 | (2006.01) |
| H03F 1/30 | (2006.01) |

(52) U.S. Cl.
CPC ......... *H03F 3/45233* (2013.01); *H03F 1/301* (2013.01); *H03F 1/523* (2013.01); *H03F 3/45183* (2013.01); *H03F 3/72* (2013.01)

(58) Field of Classification Search
CPC .................................................. H03F 3/45233
See application file for complete search history.

(56) References Cited

U.S. PATENT DOCUMENTS

| | | | | |
|---|---|---|---|---|
| 5,144,585 | A * | 9/1992 | Min | ........................ G05F 1/465 |
| | | | | 365/226 |
| 6,812,781 | B2 * | 11/2004 | Tsuchiya | .............. G09G 3/3696 |
| | | | | 327/540 |
| 6,982,597 | B2 | 1/2006 | Mitarashi | |
| 7,248,115 | B2 | 7/2007 | Nishimura | |
| 9,306,509 | B2 * | 4/2016 | Lim | ........................ H03F 1/523 |
| 2008/0204128 | A1 * | 8/2008 | Brenner | ............... H04B 15/005 |
| | | | | 327/552 |

(Continued)

FOREIGN PATENT DOCUMENTS

| | | |
|---|---|---|
| JP | 2004-289282 A | 10/2004 |
| JP | 3920236 B2 | 5/2007 |
| JP | 2015-523040 A | 8/2015 |

*Primary Examiner* — Patricia T Nguyen
(74) *Attorney, Agent, or Firm* — McDermott Will & Emery LLP

(57) ABSTRACT

An object of the present invention is to provide a semiconductor device amplifying input voltages of various standards across a wide range. According to an embodiment, a semiconductor device includes a first differential amplifier that performs an amplifying operation in a first voltage range, a second differential amplifier that performs an amplifying operation in a second voltage range, a first protection unit that conducts between the source and the drain of each pair of differential transistors included in the first and second differential amplifiers in a third voltage range, a third differential amplifier that performs an amplifying operation in a fourth voltage range, a fourth differential amplifier that performs an amplifying operation in a fifth voltage range, and a second protection unit that conducts between the source and the drain of each pair of differential transistors included in the third and fourth differential amplifiers in a sixth voltage range.

10 Claims, 12 Drawing Sheets

(56) References Cited

U.S. PATENT DOCUMENTS

| | | | |
|---|---|---|---|
| 2009/0184767 A1* | 7/2009 | Hayashi | ............... H03F 3/3022 330/253 |
| 2012/0320482 A1* | 12/2012 | Onishi | ............... H03F 3/45188 361/91.1 |
| 2013/0069720 A1* | 3/2013 | Reisiger | ............. H03F 3/45188 330/253 |

\* cited by examiner

FIG. 5
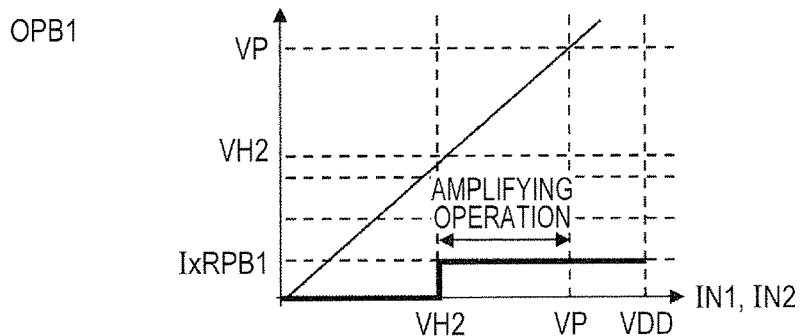
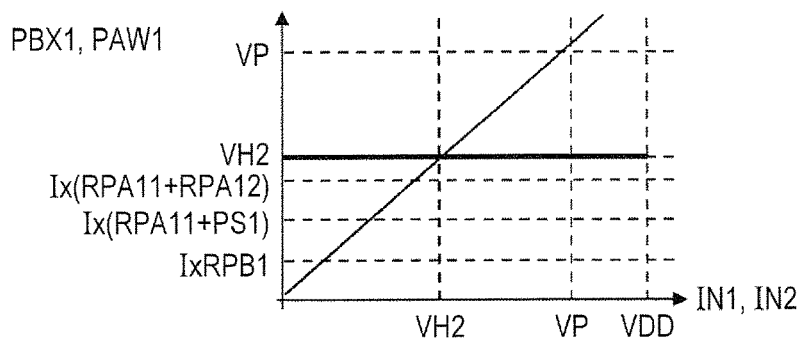
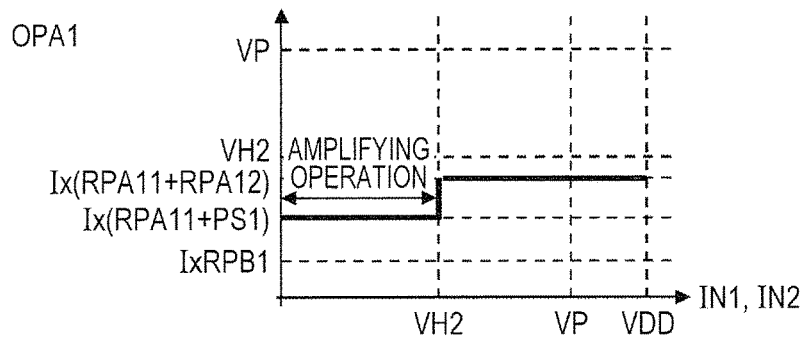
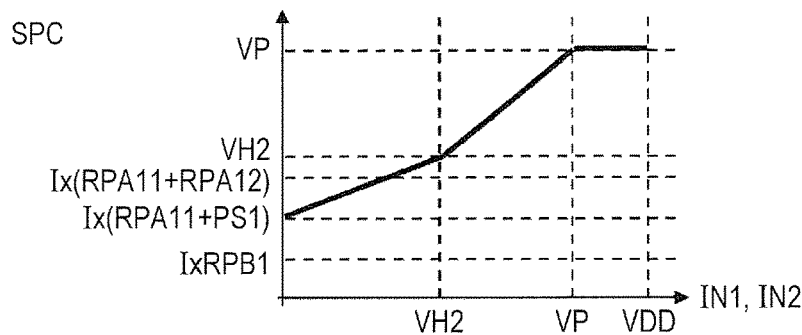

FIG. 7

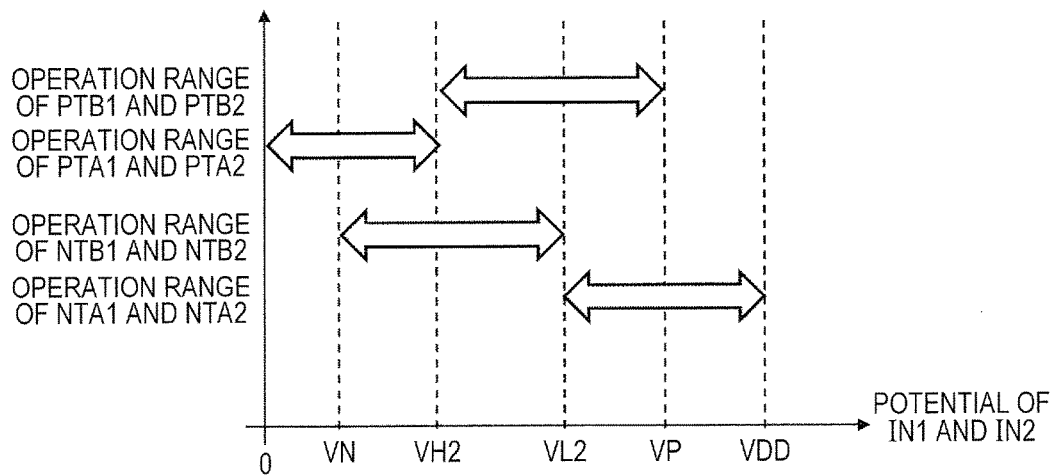

FIG. 8

| Tr<br>INPUT<br>VOLTAGE | PC1, PC2 | PD1, PD2 | NC1, NC2 | ND1, ND2 |
|---|---|---|---|---|
| GND TO VN | FIXED TO ON | FIXED TO ON | DIFFERENTIAL AMPLIFICATION | FIXED TO OFF |
| VN TO VH2 | FIXED TO ON | DIFFERENTIAL AMPLIFICATION | DIFFERENTIAL AMPLIFICATION | FIXED TO OFF |
| VH2 TO VL2 | FIXED TO ON | DIFFERENTIAL AMPLIFICATION | FIXED TO ON | DIFFERENTIAL AMPLIFICATION |
| VL2 TO VP | DIFFERENTIAL AMPLIFICATION | FIXED TO OFF | FIXED TO ON | DIFFERENTIAL AMPLIFICATION |
| VP TO VDD | DIFFERENTIAL AMPLIFICATION | FIXED TO OFF | FIXED TO ON | FIXED TO ON |

SEMICONDUCTOR DEVICE

CROSS-REFERENCE TO RELATED APPLICATIONS

The disclosure of Japanese Patent Application No. 2017-129068 filed on Jun. 30, 2017 including the specification, drawings and abstract is incorporated herein by reference in its entirety.

BACKGROUND

The present invention relates to a semiconductor device, and relates to, for example, a semiconductor device suitable for amplifying input voltages of various standards across a wide range.

For example, a differential amplifier circuit used for high-speed communications such as image processing is provided in a microcomputer mounted in a vehicle. The differential amplifier circuit is required to be capable of amplifying input voltages across a wide range in order to realize an efficient amplifying operation.

For example, each of Japanese Translation of PCT International Application Publication No. 2015-523040 and Japanese Patent No. 3920236 discloses a configuration of a differential amplifier circuit that is configured using a transistor with a breakdown voltage in accordance with an interface standard of 1.8V, 3.3V, or the like, and is capable of amplifying input voltages across a wide range. However, since the configurations of Japanese Translation of PCT International Application Publication No. 2015-523040 and Japanese Patent No. 3920236 are poor in versatility, it is necessary to manufacture different differential amplifier circuits for each interface standard. As a result, the manufacturing cost has been disadvantageously increased.

Solutions for such a problem are disclosed in Japanese Unexamined Patent Application Publication No. 2004-289282. Japanese Unexamined Patent Application Publication No. 2004-289282 discloses a configuration of a differential amplifier circuit that is configured using a transistor with a low breakdown voltage (for example, a transistor with a breakdown voltage of 1.8V), and is capable of amplifying input voltages of a plurality of interface standards, for example, a power supply voltage higher than the breakdown voltage. Accordingly, it is not necessary to manufacture different differential amplifier circuits for each interface standard, thus suppressing the manufacturing cost.

SUMMARY

However, in the case of receiving a signal with a small amplitude (for example, several hundreds of mV) in the configuration of Japanese Unexamined Patent Application Publication No. 2004-289282, a range in which the input voltages can be amplified becomes disadvantageously narrow. In other words, in the case of receiving a signal with a small amplitude in the configuration of Japanese Unexamined Patent Application Publication No. 2004-289282, the input voltages cannot be disadvantageously amplified across a wide range. The other problems and novel features will become apparent from the description of the specification and the accompanying drawings.

According to an embodiment, a semiconductor device includes: a first differential amplifying unit that includes a first pair of P-channel differential transistors in which one and the other of differential input signals are applied to the respective gates and the voltage of a first node changed in accordance with the voltage range of the differential input signals is applied to each source, and that amplifies the differential input signals in the case where the differential input signals indicate a first voltage range; a second differential amplifying unit that includes a second pair of P-channel differential transistors in which one and the other of the differential input signals are applied to the respective gates and the voltage of the first node is applied to each source, and that amplifies the differential input signals in the case where the differential input signals indicate a second voltage range higher than the first voltage range; a first protection unit that conducts between each source and each drain of the first and second pairs of differential transistors in the case where the differential input signals indicate a third voltage range higher than the first and second voltage ranges; a third differential amplifying unit that includes a third pair of N-channel differential transistors in which one and the other of the differential input signals are applied to the respective gates and the voltage of a second node changed in accordance with the voltage range of the differential input signals is applied to each source, and that amplifies the differential input signals in the case where the differential input signals indicate a fourth voltage range; a fourth differential amplifying unit that includes a fourth pair of N-channel differential transistors in which one and the other of the differential input signals are applied to the respective gates and the voltage of the second node is applied to each source, and that amplifies the differential input signals in the case where the differential input signals indicate a fifth voltage range lower than the fourth voltage range; a second protection unit that conducts between each source and each drain of the third and fourth pairs of differential transistors in the case where the differential input signals indicate a sixth voltage range lower than the fourth and fifth voltage ranges; and a synthesis circuit that generates differential output signals by synthesizing amplification results obtained by the first to fourth differential amplifying units.

According to the above-described embodiment, it is possible to provide a semiconductor device capable of amplifying input voltages of various standards across a wide range.

BRIEF DESCRIPTION OF THE DRAWINGS

FIG. 5 is a diagram for shove a relation between the voltage range of differential input signals and the voltage of each node of the P-channel differential amplifier circuit;

FIG. 7 is a diagram for showing the differential operation range of each differential amplifying unit;

FIG. 8 is a diagram for showing a relation between the voltage range of the differential input signals and the state of each pair of differential transistors provided in the synthesis circuit;

DETAILED DESCRIPTION

Hereinafter, embodiments will be described with reference to the drawings. It should be noted that since the drawings are simply illustrated, the technical scope of the embodiments shall not be narrowly construed on the basis of the description of the drawings. Further, the same elements are followed by the same signs, and the duplicated explanation will be omitted.

The present invention will be described using the following embodiments while being divided into a plurality of sections or embodiments if necessary for convenience sake. However, except for a case especially specified, the sections or embodiments are not irrelevant to each other, and one has a relationship as a part or all of a modified example, an application, a detailed explanation, or a supplementary explanation of the other. Further, when the specification refers to the number of elements (including the number of pieces, values, amounts, ranges, and the like) in the following embodiments, the number is not limited to the specific number, but may be smaller or larger than the specific number, except for a case especially specified or a case obviously limited to the specific number in principle.

Furthermore, the constitutional elements (including operational steps and the like) are not necessarily essential in the following embodiments except for a case especially specified or a case obviously deemed to be essential in principle. Likewise, when the specification refers to the shapes or positional relationships of the constitutional elements in the following embodiments, the present invention includes the constitutional elements that are substantially close or similar an shapes and the like, except for a case especially specified or a case obviously deemed not to be close or similar in principle. The same applies to the number (including the number of pieces, values, amounts, ranges, and the like).

First Embodiment

Figure 1:
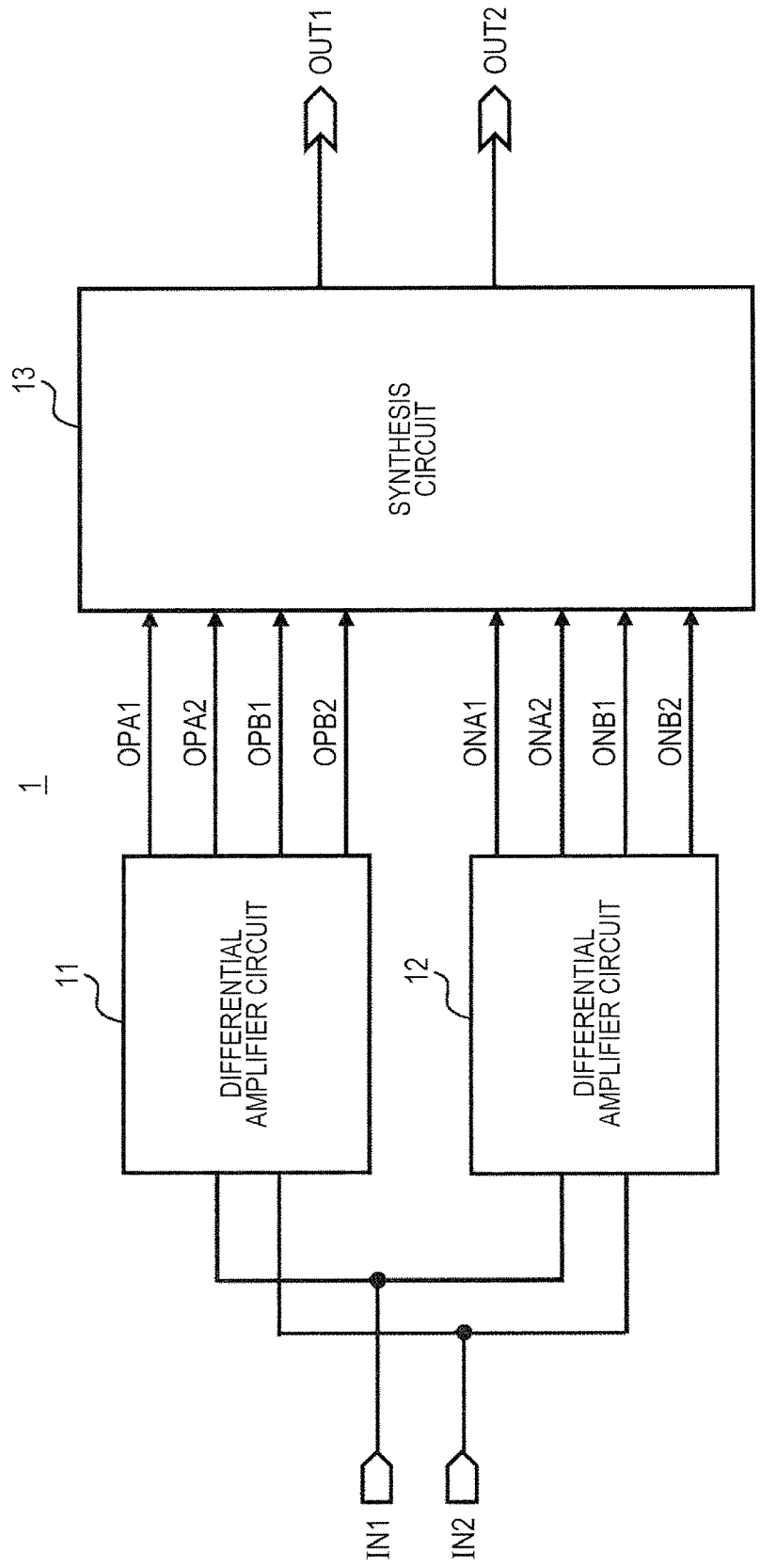
FIG. 1 is a block diagram for showing a configuration example of a semiconductor device according to a first embodiment.

FIG. 1 is a block diagram for showing a configuration example of a semiconductor device 1 according to the embodiment. The semiconductor device 1 is a device that amplifies differential input signals IN1 and IN2, and outputs differential output signals OUT1 and OUT2.

Specifically, the semiconductor device 1 includes a differential amplifier circuit (hereinafter, also referred to as a P-channel differential amplifier circuit) 11 configured using a plurality of P-channel MOS transistors, a differential amplifier circuit (hereinafter, also referred to as an N-channel differential amplifier circuit) 12 configured using a plurality of N-channel MOS transistors, and a synthesis circuit 13.

The differential amplifier circuit 11 amplifies the differential input signals IN1 and IN2, and outputs differential output signals OPA1 and OPA2 and differential output signals OPB1 and OPB2. The differential amplifier circuit 12 amplifies the differential input signals IN1 and IN2, and outputs differential output signals ONA1 and ONA2 and differential output signals ONB1 and ONB2. The synthesis circuit 13 synthesizes the respective amplification results of the differential amplifier circuits 11 and 12, and outputs the differential output signals OUT1 and OUT2. Hereinafter, each functional block will be described in detail.

(Concrete Configuration Example of Differential Amplifier Circuit 11)

Figure 2:
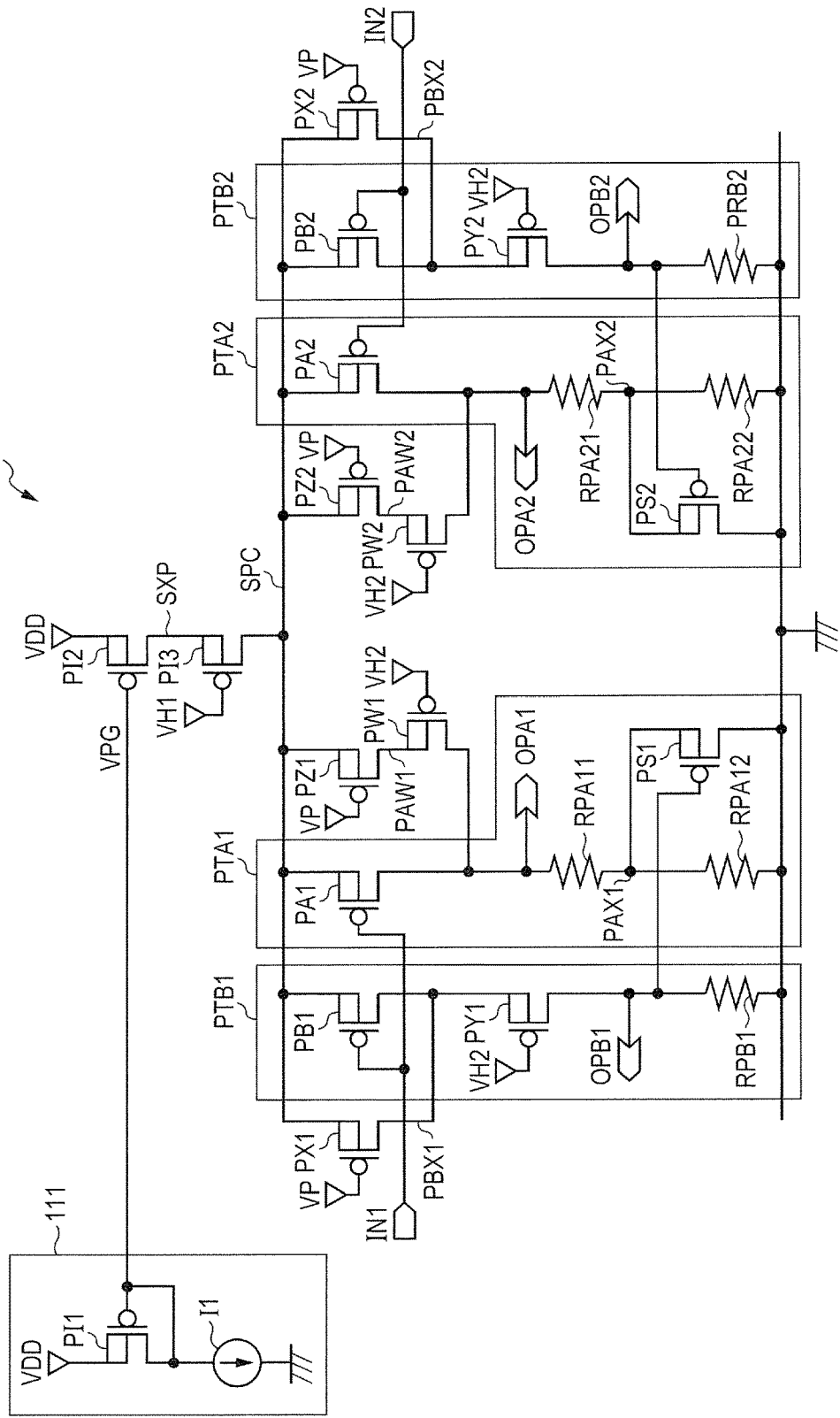
FIG. 2 is a circuit diagram for showing a configuration example of a P-channel differential amplifier circuit provided in the semiconductor device shown in FIG. 1.

FIG. 2 is a circuit diagram for showing a concrete configuration example of the differentia amplifier circuit 11.

As shown in FIG. 2, the differential amplifier circuit 11 includes P-channel MOS transistors (hereinafter, simply referred to as transistors) PA1, PA2, PB1, P12, PS1, PS2, PX1, PX2, PY1, PY2, PZ1, PZ2, PW1, PW2, PI1, PI2, and PI3, resistive elements RPA11, RPA12, RPA21, RPA22, RPB1, and RPB2, and a constant current source I1. Each of the transistors is a low breakdown voltage transistor in which the breakdown voltage of a gate oxide film is lower than a power supply voltage VDD.

In the example of FIG. 2, one PTA1 of a first differential amplifying unit is configured using the transistors PA1 and PS1 and the resistive elements RPA11 and RPA12, and the other PTA2 of the first differential amplifying unit is configured using the transistors PA2 and PS2 and the resistive elements RPA21 and P2A22. In addition, one PTB1 of a second differential amplifying unit is configured using the transistors PB1 and PY1 and the resistive element RPB1, and the other PTB2 of the second differential amplifying unit is configured using the transistors PB2 and PY2 and the resistive element RPB2. In addition, a first protection unit is configured using the transistors PX1, PX2, PZ1, PZ2, PW1, and PW2. Further, a constant voltage source 111 that generates a constant voltage VPG is configured using the transistor PI1 and the constant current source I1.

In the transistor PI1, the source is coupled to a power supply voltage terminal VDD and the drain and the gate are coupled to the input terminal of the constant current source I1. The output terminal of the constant current source I1 is coupled to a ground voltage terminal GND. In the transistor PI2, the source is coupled to the power supply voltage terminal VDD, the drain is coupled to a node SXP, and a gate voltage VPG of the transistor PI1 is applied to the gate. Thereby, a constant current in accordance with a current flowing in the constant current source I1 flows between, the source and the drain of the transistor PI2. In the transistor PI3, the source is coupled to the node SXP, the drain is coupled to a node SPC (first node), and a voltage VH1 is applied to the gate. The transistor PI3 clamps the voltage (drain voltage of the transistor PI2) of the node SXP to the voltage VH1 or higher when the current is stopped.

The source of each of the transistors PX1, PB1, PA1, PZ1, PX2, PB2, PA2, and PZ2 is coupled to the node SPC. In the case where the input signal IN1 is changed from the H level (power supply voltage VDD level) to the L level (ground voltage GND level), one of the transistors PX1, PB1, PA1, and PZ1 is configured to be turned on. In addition, in the case where the input signal IN2 is changed from the H level to the L level, one of the transistors PX2, PB2, PA2, and PZ2 is configured to be turned on. A constant current flowing in the transistors PI2 and PI3 is supplied to the transistor having been turned on.

In the transistor PA1, the source is coupled to the node SPC, the drain is coupled to an output terminal OPA1, and the input signal (one of the differential input signals) IN1 is supplied to the gate. That is, on/off of the transistor PA1 is controlled by a potential difference between the voltage of the input signal IN1 and the voltage of the node SPC.

In the transistor (fifth protection transistor) PZ1, the source is coupled to the node SPC, the drain is coupled to a node PAW1, and a fixed voltage VP is supplied to the gate. That is, on/off of the transistor PZ1 is controlled by the voltage of the node SPC. It should be noted that the transistor PZ1 is configured in such a manner that the W/L ratio (W: channel width and L: channel length) thereof is lower than that of the transistor PA1.

In the transistor (fifth clamp transistor) PW1, the source is coupled to the node PAW1, the drain is coupled to the output terminal OPA1, and a voltage VH2 is supplied to the gate. In the case where the transistor PZ1 is turned off, the transistor PW1 clamps the voltage (drain voltage of the transistor PZ1) of the node PAW1 to the voltage VH2 or higher.

In the transistor PB1, the source is coupled to the node SPC, the drain is coupled to a node PBX1, and the input signal IN1 is supplied to the gate. That is, on/off of the transistor PB1 is controlled by a potential difference between the voltage of the input signal IN1 and the voltage of the node SPC.

In the transistor (first protection transistor) PX1, the source is coupled to the node SPC, the drain is coupled to the node PBX1, and the fixed voltage VP is supplied to the gate. That is, on/off of the transistor PX1 is controlled by the voltage of the node SPC. It should be noted that the transistor PX1 is configured in such a manner that the W/L ratio thereof is lower than that of the transistor PB1.

In the transistor (first clamp transistor) PY1, the source is coupled to the node PBX1, the drain is coupled to an output terminal OPB1, and the voltage VH2 is supplied to the gate. In the case where both of the transistors PX1 and PB1 are turned off, the transistor PY1 clamps the voltage (each drain voltage of the transistors PX1 and PB1) of the node PBX1 to the voltage VH2 or higher.

The resistive element RPB1 is provided between the output terminal OPB1 and the ground voltage terminal GND. When one of the transistors PX1 and PB1 is turned on and the voltage of the node PBX1 rises to the voltage VH2 or higher to turn on the transistor PY1, a constant current from the transistors PI2 and PI3 is supplied to the resistive element RPB1. A voltage determined on the basis of the resistance value of the resistive element RPB1 and the current value of the current flowing in the resistive element RPB1 is output to the outside through the output terminal OPB1.

The resistive elements RPA11 and RPA12 are provided in series between the output terminal OPAL and the ground voltage terminal GND. In the transistor (first auxiliary transistor) PS1, the source is coupled to a node PAX1 between the resistive elements RPA11 and PRA12, the drain is coupled to the ground voltage terminal GND, and the gate is coupled to the output terminal OPB1. The transistor PS1 is turned on in the case where the voltage of the output terminal OPB1 indicates the L level (ground voltage GND level) by turning off all the transistors PX1, PB1, and PY1.

It should be noted that the resistance value of the resistive element RPA11 is set lower than that of the resistive element RPA12. Thereby, in the case where the transistor PA1 is turned on by the input signal IN1 of the L level and the transistor PS1 is turned on by the output terminal OPB1 of the L level, a low voltage determined on the basis of the low resistance of the resistive element RPA11 and the current flowing therein is output to the outside through the output terminal OPA1.

In the transistor PA2, the source is coupled to the node SPC, the drain is coupled to an output terminal OPA2, and the input signal (the other of the differential input signals) IN2 is supplied to the gate. That is, on/off of the transistor PA2 is controlled by a potential difference between the voltage of the input signal IN2 and the voltage of the node SPC.

In the transistor (sixth protection transistor) PZ2, the source is coupled to the node SPC, the drain is coupled to a node PAW2, and the fixed voltage VP is supplied to the gate. That is, on/off of the transistor PZ2 is controlled by the voltage of the node SPC. It should be noted that the transistor PZ2 is configured in such a manner that the W/L ratio thereof is lower than that of the transistor PA2.

In the transistor (sixth clamp transistor) PW2, the source is coupled to the node PAW2, the drain is coupled to the output terminal OPA2, and the voltage VH2 is supplied to the gate. In the case where the transistor PZ2 is turned off, the transistor PW2 clamps the voltage (drain voltage of the transistor PZ2) of the node PAW2 to the voltage VH2 or higher.

In the transistor PB2, the source is coupled to the node SPC, the drain is coupled to a node PBX2, and the input signal IN2 is supplied to the gate. That is, on/off of the transistor PB2 is controlled by a potential difference between the voltage of the input signal IN2 and the voltage of the node SPC.

In the transistor (second protection transistor) PX2, the source is coupled to the node SPC, the drain is coupled to the node PBX2, and the fixed voltage VP is supplied to the gate. That is, on/off of the transistor PX2 is controlled by the voltage of the node SPC. It should be noted that the transistor PX2 is configured in such a manner that the W/L ratio thereof is lower than that of the transistor PB2.

In the transistor (second clamp transistor) PY2, the source is coupled to the node PBX2, the drain is coupled to an output terminal OPB2, and the voltage VH2 is supplied to the gate. In the case where both of the transistors PX2 and PB2 are turned off, the transistor PY2 clamps the voltage (each drain voltage of the transistors PX2 and PB2) of the node PBX2 to the voltage VH2 or higher.

The resistive element RPB2 is provided between the output terminal OPB2 and the ground voltage terminal GND. When one of the transistors PX2 and PB2 is turned on and the voltage of the node PBX2 rises to the voltage VH2 or higher to turn on the transistor PY2, a constant current from the transistors PI2 and PI3 is supplied to the resistive element RPB2. A voltage determined on the basis of the resistance value of the resistive element RPB2 and the current value of the current flowing in the resistive element RPB2 is output to the outside through the output terminal OPB2.

The resistive elements RPA21 and RPA22 are provided in series between the output terminal OPA2 and the ground voltage terminal GND. In the transistor (second auxiliary transistor) PS2, the source is coupled to a node PAX2 between the resistive elements RPA21 and PRA22, the drain is coupled to the ground voltage terminal GND, and the gate is coupled to the output terminal OPB2. The transistor PS2 is turned on in the case where the voltage of the output terminal OPB2 indicates the L level (ground voltage GND level) by turning off all the transistors PX2, PB2, and PY2.

It should be noted that the resistance value of the resistive element RPA21 is set lower than that of the resistive element RPA12. Thereby, in the case where the transistor PA1 is turned on by the input signal IN2 of the L level and the transistor PS2 is turned on by the output terminal OPB2 of the L level, a low voltage determined on the basis of the low resistance of the resistive element RPA21 and the current flowing therein. is output to the outside through the output terminal OPA2.

(Concrete Configuration Example of Differential Amplifier Circuit 12)

Figure 3:
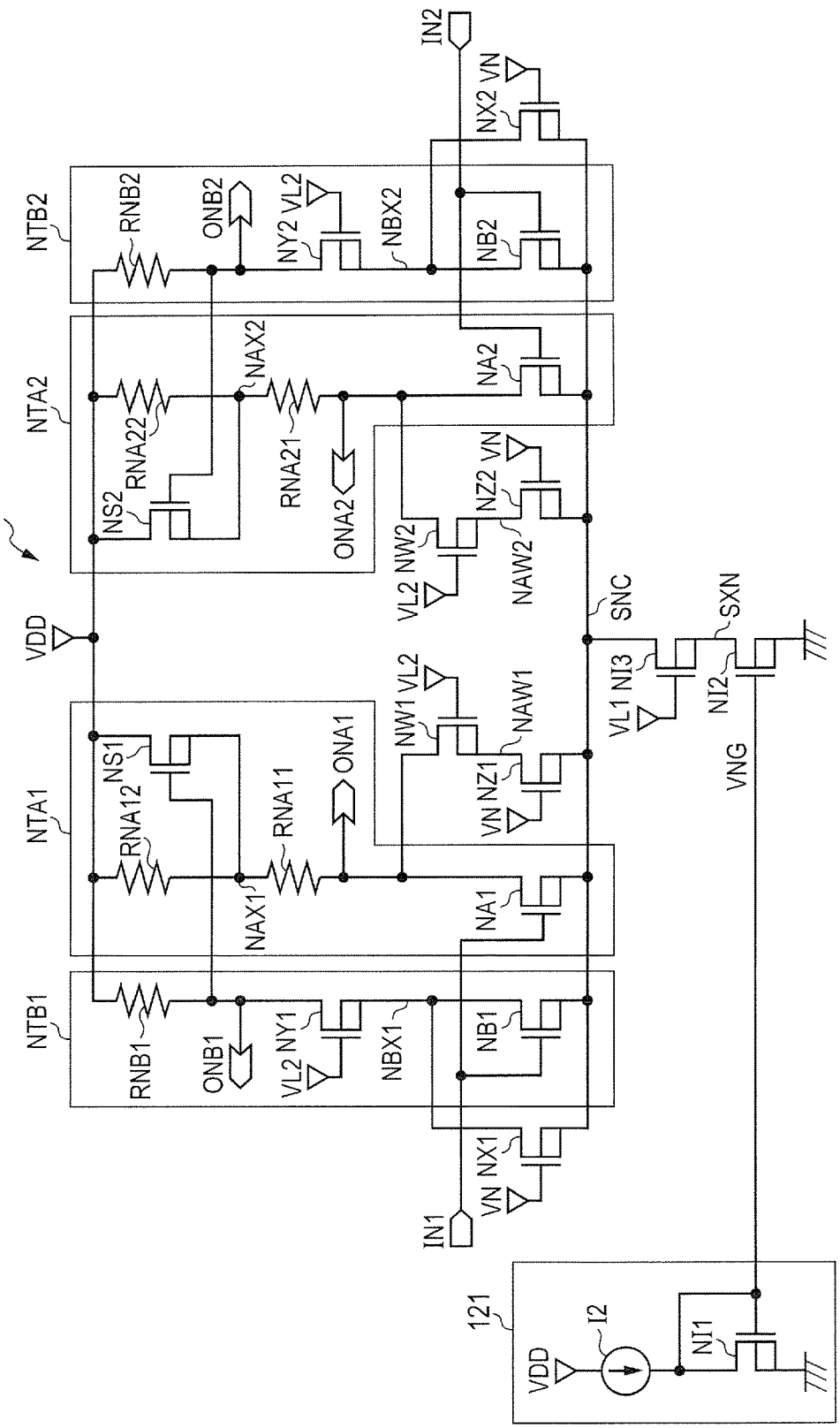
FIG. 3 is a circuit diagram for showing a configuration example of an N-channel differential amplifier circuit provided in the semiconductor device shown in FIG. 1.

FIG. 3 is a circuit diagram for showing a concrete configuration example of the N-channel differential amplifier circuit 12.

As shown in FIG. 3, the differential amplifier circuit 12 includes N-channel MOS transistors (hereinafter, simply referred to as transistors) NA1, NA2, NB1, NB2, NS1, NS2, NX1, NX2, NY1, NY2, NZ1, NZ2, NW1, NW2, NI1, NI2, and NI3, resistive elements RNA11, RNA12, RNA21, RNA22, RNB1, and RNB2, and a constant current source I2. Each of the transistors is a low breakdown voltage transistor in which the breakdown voltage of a gate oxide film is lower than the power supply voltage VDD.

In the example of FIG. 3, one NTA1 of a third differential amplifying unit is configured using the transistors NA1 and NS1 and the resistive elements RNA11 and RNA12, and the other NTA2 of the third differential amplifying unit is configured using the transistors NA2 and NS2 and the resistive elements RNA21 and RNA22. In addition, one NTB1 of a fourth differential amplifying unit is configured using the transistors NB1 and NY1 and the resistive element RNB1, and the other NTB2 of the fourth differential amplifying unit is configured using the transistors NB2 and NY2 and the resistive element RNB2. In addition, a second protection unit is configured using the transistors NX1, NX2, NZ1, NZ2, NW1, and NW2. Further, a constant voltage source I21 that generates a constant voltage VNG is configured using the transistor NI1 and the constant current source I2.

The input terminal of the constant current source I2 is coupled to the power supply voltage terminal VDD. In the transistor NI1, the source is coupled to the ground voltage terminal GND, and the drain and the gate are coupled to the output terminal of the constant current source I2. In the transistor NI2, the source is coupled to the ground voltage terminal GND, the drain is coupled to a node SXN, and a gate voltage VNG of the transistor NI1 is applied to the gate. Thereby, a constant current in accordance with a current flowing in the constant current source I2 flows between the source and the drain of the transistor NI2. In the transistor NI3, the source is coupled to the node SXN, the drain is coupled to a node SNC (second node), and a voltage VL1 is applied to the gate. The transistor NI3 clamps the voltage (drain voltage of the transistor NI2) of the node SXN to the voltage VL1 or lower when the current is stopped.

The source of each of the transistors NX1, NB1, NA1, NZ1, NX2, NB2, NA2, and NZ2 is coupled to the node SNC. In the case where the input signal IN1 is changed from the L level (ground voltage GND level) to the H level (power supply voltage VDD level), one of the transistors NX1, NB1, NA1, and NZ1 is configured to be turned on. In addition, in the case where the input signal IN2 is changed from the L level to the H level, one of the transistors NX2, NB2, NA2, and NZ2 is configured to be turned on. A constant current flowing in the transistors NI2 and NI3 is supplied to the transistor having been turned on.

In the transistor NA1, the source is coupled to the node SNC, the drain is coupled to an output terminal ONA1, and the input signal (one of the differential input signals) IN1 is supplied to the gate. That is, on/off of the transistor NA1 is controlled by a potential difference between the voltage of the input signal IN1 and the voltage of the node SNC.

In the transistor (seventh protection transistor) NZ1, the source is coupled to the node SNC, the drain is coupled to a node NAW1, and a fixed voltage VN is supplied to the gate. That is, on/off of the transistor NZ1 is controlled by the voltage of the node SNC. It should be noted that the transistor NZ1 is configured in such a manner that the W/L ratio (W: channel width and L: channel length) thereof is lower than that of the transistor NA1.

In the transistor (seventh clamp transistor) NW1, the source is coupled to the node NAW1, the drain is coupled to the output terminal ONA1, and a voltage VL2 is supplied to the gate. In the case where the transistor NZ1 is turned off, the transistor NW1 clamps the voltage (drain voltage of the transistor NZ1) of the node NAW1 to the voltage VL2 or lower.

In the transistor NB1, the source is coupled to the node SNC, the drain is coupled to a node NBX1, and the input signal IN1 is supplied to the gate. That is, on/off of the transistor NB1 is controlled by a potential difference between the voltage of the input signal IN1 and the voltage of the node SNC.

In the transistor (third protection transistor) NX1, the source is coupled to the node SNC, the drain is coupled to the node NBX1, and the fixed voltage VP is supplied to the gate. That is, on/off of the transistor NX1 is controlled by the voltage of the node SNC. It should be noted that the transistor NX1 is configured in such a manner that the W/L ratio thereof is lower than that of the transistor NB1.

In the transistor (third clamp transistor) NY1, the source is coupled to the node NBX1, the drain is coupled to an output terminal ONB1, and the voltage VL2 is supplied to the gate. In the case where both of the transistors NX1 and NB1 are turned off, the transistor NY1 clamps the voltage (each drain voltage of the transistors NX1 and NB1) of the node NBX1 to the voltage VL2 or lower.

The resistive element RNB1 is provided between the output terminal ONB1 and the power supply voltage terminal VDD. When one of the transistors NX1 and NB1 is turned on and the voltage of the node NBX1 is decreased to the voltage VL2 or lower to turn on the transistor NY1, a constant current flowing in the transistors NI2 and NI3 is supplied to the resistive element RNB1. A voltage determined on the basis of the resistance value of the resistive element RNB1 and the current value of the current flowing in the resistive element RNB1 is output to the outside through the output terminal ONB1.

The resistive elements RNA11 and RNA12 are provided in series between the output terminal ONA1 and the power supply voltage terminal VDD. In the transistor (third auxiliary transistor) NS1, the source is coupled to a node NAX1 between the resistive elements RNA11 and RNA12, the drain is coupled to the power supply voltage terminal VDD, and the gate is coupled to the output terminal ONB1. The transistor NS1 is turned on in the case where the voltage of the output terminal ONB1 indicates the H level (power supply voltage VDD level) by turning off all the transistors NX1, NB1, and NY1.

It should be noted that the resistance value of the resistive element RNA11 is set lower than that of the resistive element RNA12. Thereby, in the case where the transistor NA1 is turned on by the input signal IN1 of the H level and the transistor NS1 is turned on by the output terminal ONB1 of the H level, a high voltage dropped by a low voltage determined on the basis of the low resistance of the resistive element RNA11 and the current flowing therein is output to the outside through the output terminal ONA1.

In the transistor NA2, the source is coupled to the node SNC, the drain is coupled to an output terminal ONA2, and the input signal (the other of the differential input signals) IN2 is supplied to the gate. That is, on/off of the transistor NA2 is controlled by a potential difference between the voltage of the input signal IN2 and the voltage of the node SNC.

In the transistor (eighth protection transistor) NZ2, the source is coupled to the node SNC, the drain is coupled to a node NAW2, and the fixed voltage VN is supplied to the gate. That is, on/off of the transistor NZ2 is controlled by the voltage of the node SNC. It should be noted that the transistor NZ2 is configured in such a manner that the W/L ratio thereof is lower than that of the transistor NA2.

In the transistor (eighth clamp transistor) NW2, the source is coupled to the node NAW2, the drain is coupled to the output terminal ONA2, and the voltage VL2 is supplied to the gate. In the case where the transistor NZ2 is turned off, the transistor NW2 clamps the voltage (drain voltage of the transistor NZ2) of the node NAW2 to the voltage VL2 or lower.

In the transistor NB2, the source is coupled to the node SNC, the drain is coupled to a node NBX2, and the input signal IN2 is supplied to the gate. That is, on/off of the transistor NB2 is controlled by a potential difference between the voltage of the input signal IN2 and the voltage of the node SNC.

In the transistor (fourth protection transistor) NX2, the source is coupled to the node SNC, the drain is coupled to the node NBX2, and the fixed voltage VN is supplied to the gate. That is, on/off of the transistor NX2 is controlled by the voltage of the node SNC. It should be noted that the transistor NX2 is configured in such a manner that the W/L ratio thereof is lower than that of the transistor NB2.

In the transistor (fourth clamp transistor) NY2, the source is coupled to the node NBX2, the drain is coupled to an output terminal ONB2, and the voltage VL2 is supplied to the gate. In the case where both of the transistors NX2 and NB2 are turned off, the transistor NY2 clamps the voltage (each drain voltage of the transistors NX2 and NB2) of the node NBX2 to the voltage VL2 or lower.

The resistive element RNB2 is provided between the output terminal ONB2 and the power supply voltage terminal VDD. When one of the transistors NX2 and NB2 is turned on and the voltage of the node NBX2 is decreased to the voltage VL2 or lower to turn on the transistor NY2, a constant current flowing in the transistors NI2 and NI3 is supplied to the resistive element RNB2. A voltage determined on the basis of the resistance value of the resistive element RNB2 and the current value of the current flowing in the resistive element RNB2 is output to the outside through the output terminal ONB2.

The resistive elements RNA21 and RNA22 are provided in series between the output terminal ONA2 and the power supply voltage terminal VDD in the transistor (fourth auxiliary transistor) NS2, the source is coupled to a node NAX2 between the resistive elements RNA21 and RNA22, the drain is coupled to the power supply voltage terminal VDD, and the gate is coupled to the output terminal ONB2. The transistor NS2 is turned on in the case where the voltage of the output terminal ONB2 indicates the H level (power supply voltage VDD level) by turning off all the transistors NX2, NB2, and NY2.

It should be noted that the resistance value of the resistive element RNA21 is set lower than that of the resistive element RNA12. Thereby, in the case where the transistor NA1 is turned on by the input signal IN2 of the H level and the transistor NS2 is turned on by the output terminal ONB2 of the H level, a high voltage dropped by a low voltage determined on the basis of the low resistance of the resistive element RNA21 and the current flowing therein is output to the outside through the output terminal. ONA2.

(Concrete Configuration Example of Synthesis Circuit 13)

Figure 4:
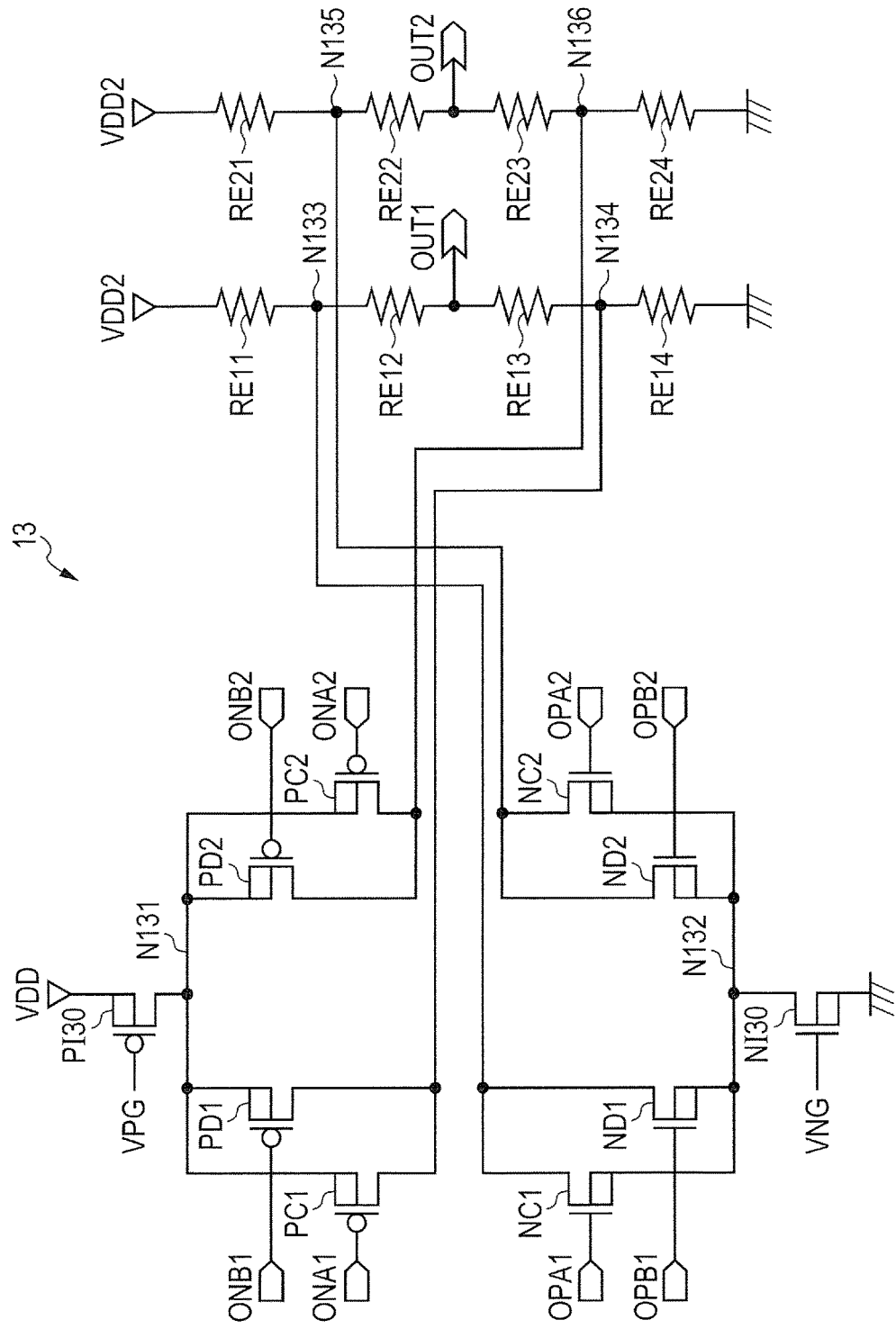
FIG. 4 is a circuit diagram for showing a configuration example of a synthesis circuit provided in the semiconductor device shown in FIG. 1.

FIG. 4 is a circuit diagram for showing a concrete configuration example of the synthesis circuit 13.

As shown in FIG. 4, the synthesis circuit 13 is a cascode differential amplifier circuit, and includes P-channel MOS transistors (hereinafter, simply referred to as transistors) PC1, PC2, PD1, PD2, and PI30, N-channel MOS transistors (hereinafter, simply referred to as transistors) NC1, NC2, ND1, ND2, and NI30, resistive elements RE11 to RE14, and resistive elements RE21 to RE24.

In the transistor PI30, the source is coupled to the power supply voltage terminal VDD, the drain is coupled to a node N131, and a voltage VPG from the constant voltage source 111 is supplied to the gate.

In the transistor PC1, the source is coupled to the node N131, the drain is coupled to a node N134 between the resistive elements RE13 and RE14, and an output voltage ONA1 of the differential amplifier circuit 12 is supplied to the gate. In the transistor PD1, the source is coupled to the node N131, the drain is coupled to the node N134, and an output voltage ONB1 of the differential amplifier circuit 12 is supplied to the gate. In the transistor PC2, the source is coupled to the node N131, the drain is coupled to a node N136 between the resistive elements RE23 and RE24, and an output voltage ONA2 of the differential amplifier circuit 12 is supplied to the gate. In the transistor PD2, the source is coupled to the node N131, the drain is coupled to the node N136, and an output voltage ONB2 of the differential amplifier circuit 12 is supplied to the gate.

In the transistor NI30, the source is coupled to the ground voltage terminal GND, the drain is coupled to a node N132, and the voltage VNG from the constant voltage source 121 is supplied to the gate.

In the transistor NC1, the source is coupled to the node N132, the drain is coupled to a node N133 between the resistive elements RE11 and RE12, and an output voltage OPAL of the differential amplifier circuit 11 is supplied to the gate. In the transistor ND1, the source is coupled to the node N132, the drain is coupled to the node N133, and an output voltage OPB1 of the differential amplifier circuit 11 is supplied to the gate. In the transistor NC2, the source is coupled to the node N132, the drain is coupled to a node N135 between the resistive elements RE21 and RE22, and an output voltage OPA2 of the differential amplifier circuit 11 is supplied to the gate. In the transistor ND2, the source is coupled to the node N132, the drain is coupled to the node N135, and an output voltage OPB2 of the differential amplifier circuit 11 is supplied to the gate.

The resistive elements RE11 to RE14 are provided in series between a power supply voltage terminal VDD2 and the ground voltage terminal GND. The resistive elements RE21 to RE24 are provided in series between a power supply voltage terminal VDD2 and the ground voltage terminal GND while being separated from the resistive elements RE11 to RE14. It should be noted that a power supply voltage VDD2 supplied to the power supply voltage terminal VDD2 is adjusted so as to be equal to or lower than the breakdown voltage of each transistor configuring an internal circuit in the following stage. The voltage of a node between the resistive elements RE12 and RE13 is output to the outside through an output terminal OUT1. The voltage of a node between the resistive elements RE22 and RE23 is output to the outside through an output terminal OUT2.

It should be noted that the synthesis circuit 13 is not limited to the configuration shown in FIG. 4, but can be appropriately changed to another configuration having the same function. For example, transistors controlled to be turned on may be provided instead of the resistive elements RE11 to RE14 and RE21 to RE24.

(Operation of Semi Conductor Device 1)

Next, an operation of the semiconductor device 1 will be described. It should be noted that among the voltages GND, VN, VH2, VL2, VP, and VDD, a relation of GND<VN<VH2<VL2<VP<VDD is satisfied. In the embodiment, as an example, the ground voltage GND is 0V, the voltage VN is 1V, the voltage VH2 is 1.5V, the voltage VL2 is 1.8V, the voltage VP is 2.3V, the power supply voltage VDD is 3.3V, and the power supply voltage VDD2 is 1.8V. It should be noted that each transistor configuring the semiconductor device 1. is a low breakdown voltage transistor in which the breakdown voltage of a gate oxide film is, for example, VDD2 (1.8V) that is lower than VDD (3.3V).

Further, the voltage VH1 is set to a value so that the voltage applied to the transistor PI2 becomes equal to or lower than the breakdown voltage of the transistor PI2 even in the case where the voltage of the node SXP is lowered after the voltage of the node SPC is lowered. For example, the voltage VH1 is set to a value obtained by subtracting the breakdown voltage of the transistor PI2 from the power supply voltage VDD among the intermediate voltages within the range between GND and VDD.

Further, the voltage VL1 is set to a value so that the voltage applied to the transistor NI2 becomes equal to or lower than the breakdown voltage even in the case where the voltage of the node SXN is increased after the voltage of the node SNC is increased. For example, the voltage VL1 is set to a value obtained by adding the breakdown voltage of the transistor NI2 to the ground voltage GND among the intermediate voltages within the range between GND and VDD.

Further, the voltage VP is set to a voltage value so that the transistors PX1 and PZ1 and the transistors PX2 and PZ2 are kept to be turned on even in the case where the transistors PA1 and PB1 and the transistors PA2 and PB2 are turned off after a potential difference between the voltage of the node SPC and each voltage of the input signals IN1 and IN2 is reduced. For example, the voltage VP is set to the threshold voltage values of these P-channel MOS transistors. Accordingly, the maximum voltage value of the operation range of the differential amplifier circuit 11 is set.

Further, the voltage VH2 is set to a value so that the voltages applied to the transistors PX1, PB1, PX2, and PB2 become equal to or lower than the breakdown voltage even in the case where no current flows to the transistors PX1, PB1, PX2, and PB2 after the voltage of the node SPC is lowered. Likewise, the voltage VH2 is set to a value so that the voltages applied to the transistors PZ1 and PZ2 become equal to or lower than the breakdown voltage even in the case where no current flows to the transistors PZ1 and PZ2 after the voltage of the node SPC is lowered.

Further, the voltage VN is set to a voltage value so that the transistors NX1 and NZ1 and the transistors NX2 and NZ2 are kept to be turned on even in the case where the transistors NA1 and NB1 and the transistors NA2 and NB2 are turned off after a potential difference between the voltage of the node SNC and each voltage of the input signals IN1 and IN2 is reduced. For example, the voltage VN is set to the threshold voltage values of these N-channel MOS transistors. Accordingly, the minimum voltage value of the operation range of the differential amplifier circuit 12 is set.

Furthermore, the voltage VL2 is set to a value so that the voltages applied to the transistors NX1, NB1, NX2, and NB2 become equal to or lower than the breakdown voltage even in the case where no current flows to the transistors NX1, NB1, NX2, and NB2 after the voltage of the node SNC is increased. Likewise, the voltage VL2 is set to a value so that the voltages applied to the transistors NZ1 and NZ2 become equal to or lower than the breakdown voltage even in the case where no current flows to the transistors NZ1 and NZ2 after the potential of the node SNC is increased.

(An Operation of the Differential Amplifier Circuit 11 in the Case Where the Input Voltages Indicate a Range Between the Voltage GND and the Voltage VN)

First, an operation of the differential amplifier circuit 11 in the case where the input signals IN1 and IN2 indicate low voltage values in the range between the voltage GND and the voltage VP will be described.

All the transistors PA1, PB1, PA2, and PB2 are turned on because the input signals IN1 and IN2 indicating voltage values in the range between the voltage GND and the voltage VN lower than the voltage VP are applied to the gates. Therefore, the voltage of the node SPC indicates a value higher than the voltages of the input signals IN1 and IN2. On the contrary, all the transistors PX1, PZ1, PX2, and PZ2 are turned off because the voltage VP indicating a value higher than the voltages of the input signals IN1 and IN2 is applied to the gates.

Since the transistor PA1 is turned on, a current flows from the node SPC towards the ground voltage terminal GND through the transistor PA1, the resistive elements RPA11 and RPA12, and the like. Likewise, since the transistor PA2 is turned on, a current flows from the node SPC towards the ground voltage terminal GND through the transistor PA2, the resistive elements RPA21 and RPA22, and the like. Thereby, the voltage of the node SPC is lowered. However, in order to keep the transistors PA1 and PA2 on, the voltage of the node SPC needs to be equal to or higher than the gate voltages (voltages of the input signals IN1 and IN2) of the transistors PA1 and PA2. Further, since the current flows through the resistive elements RPA11 and RPA12, and the like, the voltage of the node SPC needs to be equal to or higher than the voltages of the output terminals OPA1 and OPA2. Therefore, the voltage of the node SPC indicates a value in the range between the voltage GND and the voltage VN in accordance with the voltages of the input signals IN1 and IN2.

Further, since the transistors PB1 and PB2 are turned on, the voltages of the nodes PBX1 and PBX2 indicate a value (voltages GND to VN) same as the voltage of the node SPC. Here, both of the transistors PY1 and PY2 are turned off because the source voltages (voltages of the nodes PBX1 and PBX2) are lower than the gate voltage (voltage VH2). Thereby, both of the voltages of the output terminals OPB1 and OPB2 are fixed to the ground voltage GND level.

Both of the transistors PS1 and PS2 indicate low on-resistances because the voltages of the output terminals OPB1 and OPB2 fixed to the ground voltage GND level are applied to the gates. It should be noted that the on-resistances of the transistors PS1 and PS2 are set to be substantially lower than the resistance values of the resistive elements RPA12 and RPA22 that are coupled in parallel with the respective transistors.

Thus, the current flowing in the transistor PA1 flows in the resistive element RPA11, the transistor PS1 whose on-resistance is low and the resistive element RPA12 coupled in parallel with the transistor PS1. Likewise, the current flowing in the transistor PA2 flows in the resistive element RPA21, the transistor PS2 whose on-resistance is low and the resistive element RPA22 coupled in parallel with the transistor PS2.

The voltage of the output terminal OPA1 is determined on the basis of the current flowing in the transistor PA1, the resistance values of the resistive elements RPA11 and RPA12, and the on-resistance of the transistor PS1. Further, the voltage of the output terminal OPA2 is determined on the basis of the current flowing in the transistor PA2, the resistance values of the resistive elements RPA21 and RPA22, and the on-resistance of the transistor PS2. Here, the current flowing between the source and the drain of each of the transistors PA1 and PA2 is changed in accordance with the voltages of the input signals IN1 and IN2 applied to the gates of the transistors PA1 and PA2. Therefore, the voltages of the output terminals OPA1 and OPA2 can be regarded as results obtained by amplifying the voltages of the input signals IN1 and IN2, respectively.

It should be noted that there is a risk that a potential difference between the output terminal OPA1 and the gate terminal of the transistor PZ1 and a potential difference between the output terminal OPA2 and the gate terminal of the transistor PZ2 exceed the breakdown voltages of the transistors PZ1 and PZ2 in the off state. Accordingly, in the embodiment, the voltages applied to the transistors PZ1 and PZ2 are adjusted to be equal to or lower than the breakdown voltages by clamping the drain voltages (voltages of the nodes PAW1 and PAW2) of the transistors PZ1 and PZ2 to the voltage VH2 or higher by using the transistors PW1 and PW2.

In a word, in the case where the input signals IN1 and IN2 indicate voltage values in the range between the voltage GND and the voltage VN, the differential amplifier circuit 11 generates the output signals OPA1 and OPA2 obtained by amplifying the voltages of the input signals IN1 and IN2, and generates the output signals OPB1 and OPB2 fixed to the ground voltage GND level.

(An Operation of the Differential Amplifier Circuit 12 in the Case Where the Input Voltages Indicate a Range Between the Voltage GND and the Voltage VN)

Next, an operation of the differential amplifier circuit 12 in the case where the input signals IN1 and IN2 indicate low voltage values in the range between the voltage GND and the voltage VN will be described.

All the transistors NA1, NB1, NA2, and NB2 are turned off because the input signals IN1 and IN2 indicating voltage values in the range between the voltage GND and the voltage VN lower than the voltage VN are applied to the gates. On the contrary, all the transistors NX1, NZ1, NX2, and NZ2 are turned on because the voltage VN indicating a value higher than the voltages of the input signals IN1 and IN2 is applied to the gates. Therefore, the voltage of the node SNC indicates a value lower than the voltage VN.

Since the transistors NX1 and NX2 are turned on, the voltages of the nodes NBX1 and NBX2 indicate a value (voltages GND to VN) same as the voltage of the node SNC. Here, both of the transistors NY1 and NY2 are turned on because the source voltages (voltages of the nodes NBX1 and NBX2) are lower than the gate voltage (voltage VL2). Thereby, a current flows in the resistive elements RNB1 and RNB2. As a result, the output terminals ONB1 and ONB2 are fixed to voltages that are lower than the power supply voltage VDD by a voltage dropped by the resistive elements RNB1 and RNB2.

It should be noted that both of the transistors NS1 and NS2 indicate high on-resistances because the voltages of the output terminals ONB1 and ONB2 fixed to voltages that are lower than the power supply voltage VDD by a voltage dropped by the resistive elements RNB1 and RNB2 are applied. Specifically, the transistors NS1 and NS2 are virtually turned off.

Further, since the transistors NZ1 and NZ2 are turned on, the voltages of the nodes NAW1 and NAW2 indicate a value (voltages GND to VN) same as the voltage of the node SNC. Here, both of the transistors NW1 and NW2 are turned on because the source voltages (voltages of the nodes NAW1 and NAW2) are lower than the gate voltage (voltage VL2). Thereby, a current flows from the power supply voltage terminal VDD towards the node SNC through the resistive elements RNA12 and RNA11 and the transistors NW1 and NZ1. Likewise, a current flows from the power supply voltage terminal VDD towards the node SNC through the resistive elements RNA22 and RNA21 and the transistors NW2 and NZ2.

Here, the resistive elements RNA12 and RNA22 are configured using elements whose resistance values are higher than those of the resistive elements RNA11 and RNA21. Therefore, the voltages of the output terminals ONA1 and ONA2 are fixed to voltages (voltages GND to VN) same as the nodes NAW1 and NAW2.

In a word, in the case where the input signals IN1 and IN2 indicate voltage values in the range between the voltage GND and the voltage VN, the differential amplifier circuit 12 generates the output signals ONA1, ONA2, ONB1, and ONB2 fixed to predetermined voltages irrespective of the input signals IN1 and IN2. It should be noted that it is only necessary for each of the transistors NZ1 and NZ2 to suppress the voltages applied to the pair of differential transistors NA1 and NA2 to the breakdown voltages or lower. Thus, each of the transistors NZ1 and NZ2 may be configured in such a manner that the W/L ratio thereof is lower than those of the pair of differential transistors NA1 and NA2. Further, it is only necessary for each of the transistors NX1 and NX2 to suppress the voltages applied to the pair of differential transistors NB1 and NB2 to the breakdown voltages or lower. Thus, each of the transistors NX1 and NX2 may be configured in such a manner that the W/L ratio thereof is lower than those of the pair of differential transistors NB1 and NB2.

(An Operation of the Differential Amplifier Circuit 11 in the Case Where the Input Voltages Indicate a Range Between the Voltage VN and the Voltage VH2)

Next, an operation. of the differential amplifier circuit 11 in the case where the input signals IN1 and IN2 indicate voltage values in the range between the voltage VN and the voltage VH2 will be described.

The voltages of the input signals IN1 and IN2 indicating the voltages VN to VH2 are lower than the voltages VP and VH2. Therefore, the operation of the differential amplifier circuit 11 in this case is basically the same as a case in which the input signals IN1 and IN2 indicate the voltage values of the voltages GND to VN. Thus, the explanation thereof will be omitted.

In a word, in the case where the input signals IN1 and IN2 indicate voltage values in the range between the voltage VN and the voltage VH2, the differential amplifier circuit 11 generates the output signals OPA1 and OPA2 obtained by amplifying the voltages of the input signals IN1 and IN2, and generates the output signals OPB1 and OPB2 fixed to the ground voltage GND level.

(An Operation of the Differential Amplifier Circuit 12 in the Case Where the Input Voltages Indicate a Range Between the Voltage VN and the Voltage VH2)

Next, an operation of the differential amplifier circuit 12 in the case where the input signals IN1 and IN2 indicate voltage values in the range between the voltage VN and the voltage VH2 will be described.

All the transistors NA1, NB1, NA2, and NB2 are turned on because the input signals IN1 and IN2 indicating voltage values in the range between the voltage VN and the voltage VH2 higher than the voltage VN are applied to the gates. Therefore, the voltage of the node SNC indicates a value lower than the voltages of the input signals IN1 and IN2. On the contrary, all the transistors NX1, NZ1, NX2, and NZ2 are turned off because the voltage VN indicating a value lower than the voltages of the input signals IN1 and IN2 is applied to the gates.

Since the transistors NB1 and NB2 are turned on, the voltages of the nodes NBX1 and NBX2 indicate a value (voltages VP to VH2) same as the voltage of the node SNC. Here, both of the transistors NY1 and NY2 are turned on because the source voltages (voltages of the nodes NBX1 and NBX2) are lower than the gate voltage (voltage VL2). Thereby, a current flows from the power supply voltage terminal VDD towards the node SNC through the resistive element RNB1 and the transistors NY1 and NB1. Likewise, a current flows from the power supply voltage terminal VDD towards the node SNC through the resistive element RNB2 and the transistors NY2 and NB2.

The voltage of the output terminal ONB1 is determined on the basis of the current flowing in the transistor NB1 and the resistance value of the resistive element RNB1. Further, the voltage of the output terminal ONB2 is determined on the basis of the current flowing in the transistor NB2 and the resistance value of the resistive element RNB2. Here, the current flowing between the source and the drain of each of the transistors NB1 and NB2 is changed in accordance with the voltages of the input signals IN1 and IN2 applied to the gates of the transistors NB1 and NB2. Therefore, the voltages of the output terminals ONB1 and ONB2 can be regarded as results obtained by amplifying the voltages of the input signals IN1 and IN2, respectively.

Both of the transistors NS1 and NS2 indicate high on-resistances because the voltages of the output terminals ONB1 and ONB2 indicating values lower than the power supply voltage VDD are applied. Specifically, the transistors NS1 and NS2 are virtually turned off. Thus, the current flowing in the transistor NA1 flows in the resistive element RNA12 and the resistive element RNA11. Likewise, the current flowing in the transistor NA1 flows in the resistive element RNA22 and the resistive element RNA21.

Here, the resistive elements RNA12 and RNA22 are configured using elements whose resistance values are higher than those of the resistive elements RNA11 and RNA21. Therefore, both of the voltages of the output terminals ONA1 and ONA2 are fixed to a voltage same as the node SNC.

In a word, in the case where the input signals IN1 and IN2 indicate voltage values in the range between the voltage VN and the voltage VH2 the differential amplifier circuit 12 generates the output signals ONA1 and ONA2 fixed to predetermined voltages, and generates the output signals ONB1 and ONB2 obtained by amplifying the voltages of the input signals IN1 and IN2.

(An Operation of the Differential Amplifier Circuit 11 in the Case Where the Input Voltages Indicate a Range Between the Voltage VH2 and the Voltage VL2)

Next, an operation of the differential amplifier circuit 11 in the case where the input signals IN1 and IN2 indicate voltage values in the range between the voltage VH2 and the voltage VL2 will be described.

All the transistors PA1, PB1, PA2, and PB2 are turned on because the input signals IN1 and IN2 indicating voltage values in the range between the voltage VH2 and the voltage VL2 lower than the voltage VP are applied to the gates. Therefore, the voltage of the node SPC indicates a value higher than the voltages of the input signals IN1 and IN2. On the contrary, all the transistors PX1, PZ1, PX2, and PZ2 are turned off because the voltage VP indicating a value higher than the voltages of the input signals IN1 and IN2 is applied to the gates.

Since the transistors PB1 and PB2 are turned on, the voltages of the nodes PBX1 and PBX2 indicate a value in the range between the voltage VH2 and VL2 same as the voltage of the node SPC. Here, both of the transistors PY1 and PY2 are turned on because the source voltages (voltages of the nodes PBX1 and PBX2) are higher than the gate voltage (voltage VH2). Thereby, a current flows from the node SPC towards the ground voltage terminal GND through the transistors PB1 and PY1 and the resistive element RPB1. Likewise, a current flows from the node SPC towards the ground voltage terminal GND through the transistors PB2 and PY2 and the resistive element RPB2.

The voltage of the output terminal OPB1 is determined on the basis of the current flowing in the transistor PB1 and the resistance value of the resistive element RPB1. Further, the voltage of the output terminal OPB2 is determined on the basis of the current flowing in the transistor PB2 and the resistance value of the resistive element RPB2. Here, the current flowing between the source and the drain of each of the transistors PB1 and PB2 is changed in accordance with the voltages of the input signals IN1 and IN2 applied to the gates of the transistors PB1 and PB2. Therefore, the voltages of the output terminals OPB1 and OPB2 can be regarded as results obtained by amplifying the voltages of the input signals IN1 and IN2, respectively.

Both of the transistors PS1 and PS2 indicate on-resistances higher than the resistance values of the resistive elements RPA12 and RPA22 because the voltages of the output terminals OPB1 and OPB2 indicating values higher than the ground voltage GND are applied. Thus, the current flowing in the transistor PA1 flows in the resistive element RPA11, the resistive element RPA12 and the transistor PS1 coupled in parallel with the resistive element RPA12. Likewise, the current flowing in the transistor PA2 flows in the resistive element RPA21, the resistive element RPA22 and the transistor PS2 coupled in parallel with the resistive element RPA22.

Here, the resistive elements RPA12 and RPA22 are configured using elements whose resistance values are higher than those of the resistive elements RPA11 and RPA21. Further, the transistors PS1 and PS2 indicate high on-resistances. Therefore, both of the voltages of the output terminals OPA1 and OPA2 are fixed to a voltage same as the node SPC.

In a word, in the case where the input signal IN1 and IN2 indicate voltage values in the range between the voltage VH2 and the voltage VL2, the differential amplifier circuit 11 generates the output signals OPA1 and OPA2 fixed to predetermined voltages, and generates the output signals OPB1 and OPB2 obtained by amplifying the voltages of the input signals IN1 and IN2.

An operation of the differential amplifier circuit 12 in the case where the input voltages indicate a range between the voltage VH2 and the voltage VL2).

Next, an operation of the differential amplifier circuit 12 in the case where the input signals IN1 and IN2 indicate voltage values in the range between the voltage VH2 and the voltage VL2 will be described.

The voltages of the input signals IN1 and IN2 indicating the voltages VH2 to VH2 are higher than the voltage VN and lower than the voltage VL2. Therefore, the operation of the differential amplifier circuit 12 in this case is basically the same as a case in which the input signals IN1 and IN2 indicate the voltage values of the voltages VN to VH2. Thus, the explanation thereof will be omitted.

In a word, in the case where the input signals IN1 and IN2 indicate voltage values in the range between the voltage VH2 and the voltage VL2, the differential amplifier circuit 12 generates the output signals ONA1 and ONA2 fixed to predetermined voltages, and generates the output signals ONB1 and ONB2 obtained by amplifying the voltages of the input signals IN1 and IN2.

(An Operation of the Differential Amplifier Circuit 11 in the Case Where the Input Voltages Indicate a Range Between the Voltage VH2 and the Voltage VP)

Next, an operation of the differential amplifier circuit 11 in the case where the input signals IN1 and IN2 indicate voltage values in the range between the voltage VL2 and the voltage VP will be described.

The voltages of the input signals IN1 and IN2 indicating the voltages VL2 to VP are lower than the voltage VP and higher than the voltage VH2. Therefore, the operation of the differential amplifier circuit 11 in this case is basically the same as a case in which the input signals IN1 and IN2 indicate the voltage values of the voltages VH2 to VL2. Thus, the explanation thereof will be omitted.

In a word, in the case where the input signals IN1 and IN2 indicate voltage values in the range between the voltage VL2 and the voltage the differential amplifier circuit 11 generates the output signals OPA1 and OPA2 fixed to predetermined voltages, and generates the output signals OPB1 and OPB2 obtained by amplifying the voltages of the input signals IN1 and IN2.

(An Operation of the Differential Amplifier Circuit 12 in the Case Where the Input Voltages Indicate a Range Between the Voltage VL2 and the voltage VP)

Next, an operation of the differential amplifier circuit 12 in the case where the input signals IN1 and IN2 indicate voltage values in the range between the voltage VL2 and the voltage VP will be described.

All the transistors NA1, NB1, NA2, and NB2 are turned on because the input signals IN1 and IN2 indicating voltage values in the range between the voltage VL2 and the voltage VP higher than the VN are applied to the gates. Therefore, the voltage of the node SNC indicates a value lower than the voltages of the input signals IN1 and IN2. On the contrary, all the transistors NX1, NZ1, NX2, and NZ2 are turned off because the voltage VN indicating a value lower than the voltages of the input signals IN1 and IN2 is applied to the gates.

Since the transistor NA1 is turned on, a current flows from the power supply voltage terminal VDD towards the node SNC through the resistive elements RNA12 and RNA11, the transistor NA1, and the like. Likewise, since the transistor NA2 is turned on, a current flows from the power supply voltage terminal VDD towards the node SNC through the resistive elements RNA22 and RNA21, the transistor NA2, and the like. Thereby, the voltage of the node SNC rises. However, in order to keep the transistors NA1 and NA2 on, the voltage of the node SNC needs to be equal to or lower than the gate voltages (voltages of the input signals IN1 and IN2) of the transistors NA1 and NA2. Further, since the current flows through the resistive elements RNA12 and RNA11, and the like, the voltage of the node SNC needs to be equal to or lower than the voltages of the output terminals ONA1 and ONA2. Therefore, the voltage of the node SNC indicates a value in the range between the voltage VL2 and the voltage VP in accordance with the voltages of the input signals IN1 and IN2.

Further, since the transistors NB1 and NB2 are turned on, the voltages of the nodes NBX1 and NBX2 indicate a value (voltages VL2 to VP) same as the voltage of the node SNC. For example, the voltages of the nodes NBX1 and NBX2 indicate a value in the range of 1.8V to 2.3V same as that of the node SNC. Here, both of the transistors NY1 and NY2 are turned off because the source voltages (voltages of the nodes NBX1 and NBX2) are higher than the gate voltage (voltage VL2). Thereby, both of the voltages of the output terminals ONB1 and ONB2 are fixed to the power supply voltage VDD level.

Both of the transistors NS1 and NS2 indicate low on-resistances because the voltages of the output terminals ONB1 and ONB2 fixed to the power supply voltage VDD level are applied to the gates. It should be noted that the on-resistances of the transistors NS1 and NS2 are set to be substantially lower than the resistance values of the resistive elements RNA12 and RNA22 that are coupled in parallel with the respective transistors. Thus, the current flowing in the transistor NA1 flows in the resistive element RNA12 and the transistor NS1 whose on-resistance is lowthat are coupled in parallel, and the resistive element RNA11. Likewise, the current flowing in the transistor NA2 flows in the resistive element RNA22 and the transistor NS2 whose on-resistance is low that are coupled in parallel, and the resistive element RNA21.

The voltage of the output terminal ONA1 is determined on the basis of the current flowing in the transistor NA1, the resistance values of the resistive elements RNA11 and RNA12, and the on-resistance of the transistor NS1. Further, the voltage of the output terminal ONA2 is determined on the basis of the current flowing in the transistor NA2, the resistance values of the resistive elements RNA21 and RNA22, and the on-resistance of the transistor NS2. Here, the current flowing between the source and the drain of each of the transistors NA1 and NA2 is changed in accordance with the voltages of the input signals and IN2 applied to the gates of the transistors NA1 and NA2. Therefore, the voltages of the output terminals ONA1 and ONA2 can be regarded as results obtained by amplifying the voltages of the input signals IN1 and IN2, respectively.

It should be noted that there is a risk that a potential difference between the output terminal ONA1 and the gate terminal of the transistor NZ1 and a potential difference between the output terminal ONA2 and the gate terminal of the transistor NZ2 exceed the breakdown voltages of the transistors NZ1 and NZ2 in the off state. Accordingly, in the embodiment, the voltages applied to the transistors NZ1 and NZ2 are adjusted to be equal to or lower than the breakdown voltages by clamping the drain voltages (voltages of the nodes NAW1 and NAW2) of the transistors NZ1 and NZ2 to the breakdown voltage VL2 or lower by using the transistors NW1 and NW2.

In a word, in the case where the input signals IN1 and IN2 indicate voltage values in the range between the voltage VL2 and the voltage VP, the differential amplifier circuit 12 generates the output signals ONA1 and ONA2 obtained by amplifying the voltages of the input signals IN1 and IN2, and generates the output signals ONB1 and ONB2 fixed to the power supply voltage VDD level.

(An Operation of the Differential Amplifier Circuit 11 in the Case Where the Input Voltages Indicate a Range Between the voltage VP and the Voltage VDD)

Next, an operation of the differential amplifier circuit 11 in the case where the input signals IN1 and IN2 indicate voltage values in the range between the voltage VP and the voltage VDD will be described.

All the transistors PA1, PB1, PA2, and PB2 are turned off because the input signals IN1 and IN2 indicating voltage values in the range between. the voltage VP and the voltage VDD higher than the voltage VP are applied to the gates. On the contrary, all the transistors PX1, PZ1, PX2, and PZ2 are turned on because the voltage VP indicating a value lower than the voltages of the input signals IN1 and IN2 is applied to the gates. Therefore, the voltage of the node SPC indicates a value higher than the voltage VP.

Since the transistors PX1 and PX2 are turned on, the voltages of the nodes PBX1 and PBX2 indicate a value (voltages VP to VDD) same as the voltage of the node SPC. Here, both of the transistors PY1 and PY2 are turned on because the source voltages (voltages of the nodes PBX1 and PBX2) are higher than the gate voltage (voltage VH2). Thereby, a current flows in the resistive elements RPB1 and RPB2. As a result, the output terminals OPB1 and OPB2 are fixed to voltages that are higher than the ground voltage GND by a voltage dropped by the resistive elements RPB1 and RPB2, It should be noted that both of the transistors PS1 and PS2 indicate high on-resistances because the voltages of the output terminals OPB1 and OPB2 fixed to voltages that are higher than the ground voltage GND by a voltage dropped by the resistive elements RPB1 and RPB2 are applied. Specifically, the transistors PS1 and PS2 are virtually turned off Further, since the transistors PZ1 and PZ2 are turned on, the voltages of the nodes PAW1 and PAW2 indicate a value (voltages VP to VDD) same as the voltage of the node SPC. Here, both of the transistors PW1 and PW2 are turned on because the source voltages (voltages of the nodes PAW1 and PAW2) are higher than the gate voltage (voltage VH2). Thereby, a current flows from the node SPC towards the ground voltage terminal GND through the transistors PZ1 and PW1 and the resistive elements RPA11 and PRA12. Thereby, since the voltage of the output terminal OPA1 rises and is fixed, the voltage between the gate and the drain of the transistor PA1 in the off state is suppressed to the breakdown voltage or lower. Likewise, a current flows from the node SPC towards the ground voltage terminal GND through the transistors PZ2 and PW2 and the resistive elements RPA21 and RPA22. Thereby, since the voltage of the output terminal OPA2 rises and is fixed, the voltage between the gate and the drain of the transistor PA2 in the off state is suppressed to the breakdown voltage or lower.

Here, the resistive elements RPA12 and RPA22 are configured using elements whose resistance values are higher than those of the resistive elements RPA11 and RPA21. Therefore, the voltages of the output terminals OPA1 and OPA2 are fixed to voltages (voltages VP to VDD) same as the nodes PAW1 and PAW2.

In a word, in the case where the input signals IN1 and IN2 indicate voltage values in the range between the voltage VP and the voltage VDD, the differential amplifier circuit 11 generates the output signals OPA1, OPA2, OPB1, and OPB2 fixed to predetermined voltages irrespective of the input signals IN1 and IN2. It should be noted that it is only necessary for each of the transistors PZ1 and PZ2 to suppress the voltages applied to the pair of differential transistors PA1 and PA2 to the breakdown voltages or lower. Thus, each of the transistors PZ1 and PZ2 may be configured in such a manner that the W/L ratio thereof is lower than those of the pair of differential transistors PA1 and PA2. Further, it is only necessary for each of the transistors PX1 and PX2 to suppress the voltages applied to the pair of differential transistors PB1 and PB2 to the breakdown voltages or lower. Thus, each of the transistors PX1 and PX2 may be configured in such a manner that the W/L ratio thereof is lower than those of the pair of differential transistors PB1 and PB2.

(An Operation of the Differential Amplifier Circuit 12 in the Case Where the Input Voltages Indicate a Range Between the Voltage VP and the Voltage VDD)

Next, an operation of the differential amplifier circuit 12 in the case where the input signals IN1 and IN2 indicate voltage values in the range between the voltage VP and the voltage VDD will be described.

The voltages of the input signals IN1 and IN2 indicating the voltages VP to VDD are higher than the voltages VN and VL2. Therefore, the operation of the differential amplifier circuit 12 in this case is basically the same as a case in which the input signals IN1 and IN2 indicate the voltage values of the voltages VL2 to VP. Thus, the explanation thereof will be omitted.

In a word, in the case where the input signals IN1 and IN2 indicate voltage values in the range between the voltage VP and the voltage VDD, the differential amplifier circuit 12 generates the output signals ONA1 and ONA2 obtained. by amplifying the voltages of the input signals IN1 and IN2, and generates the output signal ONB1 and ONB2 fixed to the power supply voltage VDD level.

It should be noted that as the voltage of the node SPC, for example, a higher voltage between the two kinds of voltages shown below is employed. First, the first kind of voltage is a source voltage with respect to a gate voltage necessary for turning on the respective transistors PA1, PA2, PB1, PB2, PX1, PX2, PZ1, and PZ2. For example, of a voltage between the gate and the source necessary for turning on a transistor is assumed as 0V, the value of the source voltage of the transistor, that is, the value of the gate voltage of the transistor is employed as the voltage of the node SPC. Next, the second kind of voltage is a source voltage with respect to a drain voltage necessary for turning on the respective transistors PA1, PA2, PB1, PB2, PX1, PX2, PZ1, and PZ2. The drain voltage is determined on the basis of, for example, the resistance value of the resistive element and the current flowing in the resistive element.

FIG. 5 is a diagram for showing a relation between the voltage range of the differential input signals IN1 and IN2 and the voltage of each node of the differential amplifier circuit 11. As shown in FIG. 5, in the differential amplifier circuit 11, the voltage of the node SPC coupled to each source of the pair of differential transistors PA1 and PA2, the pair of differential transistors PB1 and PB2, the pair of differential transistors PX1 and PX2, and the pair of differential transistors PZ1 and PZ2 varies in accordance with the voltages of the input signals IN1 and IN2. In addition, the amplifying operation is switched to the first differential amplifying units PTA1 and PTA2 or the second differential amplifying units PTB1 and PTB2 in accordance with the voltage range of the node SPC (in other words, in accordance with the voltage range of the differential input signals IN1 and IN2).

Figure 6:
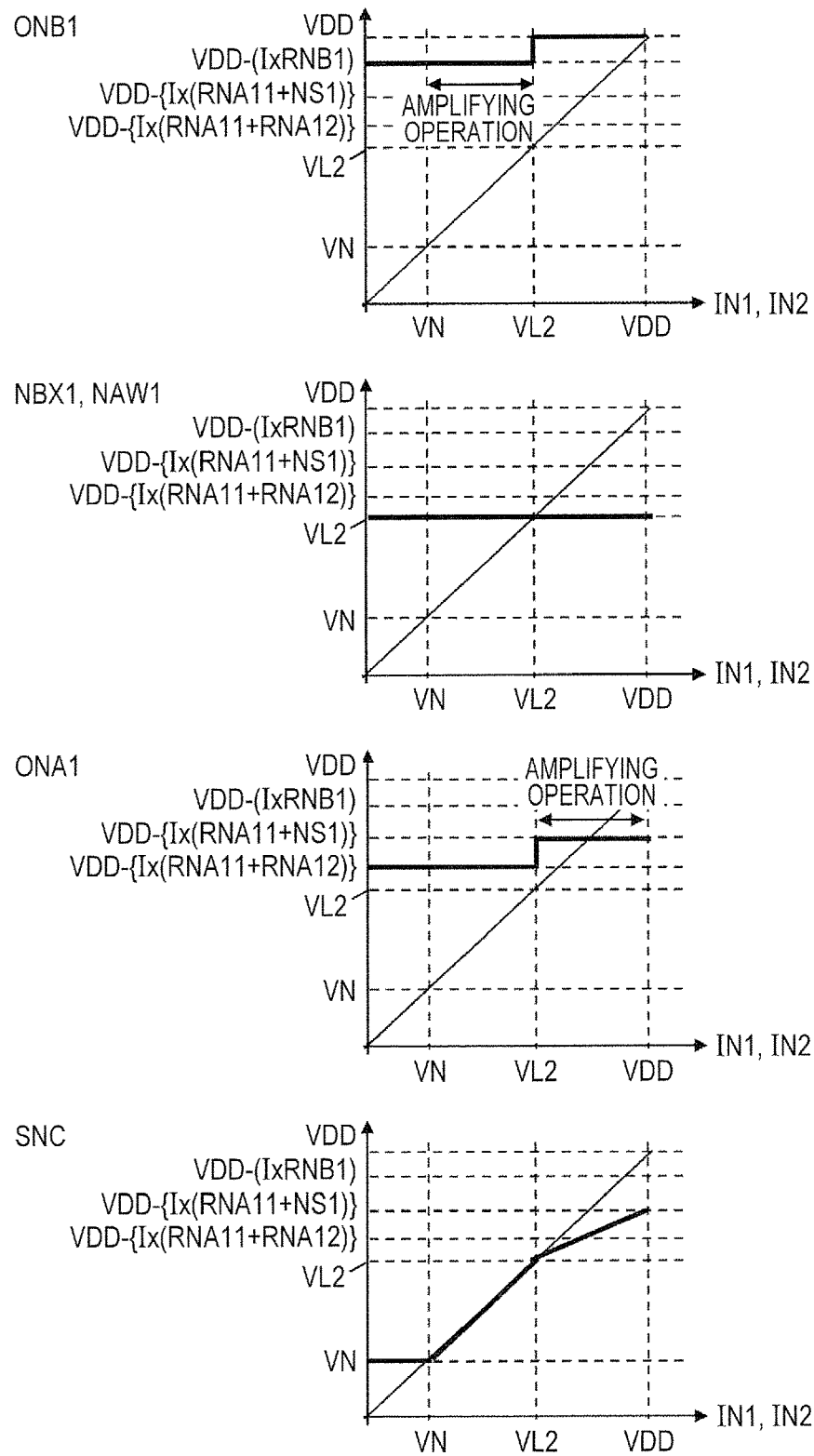
FIG. 6 is a diagram for showing a relation between the voltage range of the differential input signals and the voltage of each node of the N-channel differential amplifier circuit.

FIG. 6 is a diagram for showing a relation between the voltage range of the differential input signals IN1 and IN2 and the voltage of each node of the differential amplifier circuit 12. As shown in FIG. 6, in the differential amplifier circuit 12, the voltage of the node SNC coupled to each source of the pair of differential transistors NA1 and NA2, the pair of differential transistors NB1 and NB1, the pair of differential transistors NX1 and NX2, and the pair of differential transistors NZ1 and NZ2 varies in accordance with the voltages of the input signals IN1 and IN2. In addition, the amplifying operation is switched to the third differential amplifying units NTA1 and NTA2 or the second differential amplifying units NTB1 and NTB2 in accordance with the voltage range of the node SNC (in other words, in accordance with the voltage range of the differential input signals IN1 and IN2).

FIG. 7 is a diagram for showing the differential operation range of each differential amplifying unit. As shown in FIG. 7, one of the differential amplifying units performs the differential operation in the entire voltage range of the input signals IN1 and IN2. Namely, the voltages of the input signals IN1 and IN2 are amplified in a wide range.

(Operation of Synthesis Circuit 13)

Next, an operation of the synthesis circuit 13 will be described.

First, an operation of the synthesis circuit 13 in the case where the input signals IN1 and IN2 indicate voltage values in the range between the voltage GND and the voltage VN will be described. In this case, the differential amplifier circuit 11 generates the output signals OPA1 and OPA2 obtained by amplifying the voltages of the input signals IN1 and IN2, and generates the output signals OPB1 and OPB2 fixed to the ground voltage GND level. Further, the differential amplifier circuit 12 generates the output signals ONA1, ONA2 ONB1, and ONB2 fixed to predetermined voltages irrespective of the input signals IN1 and IN2.

At this time, all the transistors PC1, PC2, PD1, and PD2 are turned on, but do not perform the differential operation because the respective output signals ONA1, ONA2, ONB1, and ONB2 fixed to the predetermined voltages are applied to the gates. Further, both of the transistors ND1 and ND2 are tuned off because the respective output signals OPB1 and OPB2 fixed to the ground voltage GND level are applied to the gates. On the contrary, the transistors NC1 and NC2 perform the differential operation because the respective differential signals OPA1 and OPA2 are applied to the gates. Thereby, the differential signals are output from the output terminals OUT1 and OUT2 to the outside of the synthesis circuit 13.

Next, an operation of the synthesis circuit 13 in the case where the input signals IN1 and IN2 indicate voltage values in the range between the voltage VN and the voltage VH2 will be described. In this case, the differential amplifier circuit 11 generates the output signals OPA1 and OPA2 obtained by amplifying the voltages of the input signals IN1 and IN2, and generates the output signals OPB1 and OPB2 fixed to the ground voltage GND level. Further, the differential amplifier circuit 12 generates the output signals ONA1 and ONA2 fixed to predetermined voltages, and generates the output signals ONB1 and ONB2 obtained by amplifying the voltages of the input signals IN1 and IN2.

At this time, both of the transistors PC1 and PC2 are turned on, but do not perform the differential operation because the respective output. signals ONA1 and ONA2 fixed to the predetermined voltages are applied to the gates. Further, both of the transistors ND1 and ND2 are tuned off because the respective output signals OPB1 and OPB2 fixed to the ground voltage GND level are applied to the gates. On the contrary, the transistors PD1 and PD2 perform, the differential operation because the respective differential signals ONB1 and ONB2 are applied to the gates. Further, the transistors NC1 and NC2 perform the differential operation because the respective differential signals OPA1 and OPA2 are applied to the gates. Thereby, the differential signals are output from the output terminals OUT1 and OUT2 to the outside of the synthesis circuit 13.

Next, an operation of the synthesis circuit 13 in the case where the input, signals IN1 and IN2 indicate voltage values in the range between the voltage VH2 and the voltage VH2 will be described. In this case, the differential amplifier circuit 11 generates the output signals OPA1 and OPA2 fixed to predetermined voltages, and generates the output signals OPB1 and OPB2 obtained by amplifying the voltages of the input signals IN1 and IN2. Further, the differential amplifier circuit 12 generates the output signals ONA1 and ONA2 fixed to predetermined voltages, and generates the output signals ONB1 and ONB2 obtained by amplifying the voltages of the input signals IN1 and IN2.

At this time, both of the transistors PC1 and PC2 are turned on, but do not perform the differential operation because the respective output signals ONA1 and ONA2 fixed to the predetermined voltages are applied to the gates. Further, both of the transistors NC1 and NC2 are turned on, but do not perform the differential operation because the respective output signals OPA1 and OPA2 fixed to the predetermined voltages are applied to the gates. On the contrary, the transistors PD1 and PD2 perform the differential operation because the respective differential signals ONB1 and ONB2 are applied to the gates. Further, the transistors ND1 and ND2 perform the differential operation because the respective differential signals OPB1 and OPB2 are applied to the gates. Thereby, the differential signals are output from the output terminals OUT1 and OUT2 to the outside of the synthesis circuit 13.

Next, an operation of the synthesis circuit 13 in the case where the input signals IN1 and IN2 indicate voltage values in the range between the voltage VL2 and the voltage VP will be described. In this case, the differential amplifier circuit 11 generates the output signals OPA1 and OPA2 fixed to predetermined voltages, and generates the output signals OPB1 and OPB2 obtained by amplifying the voltages of the input signals IN1 and IN2. Further, the differential amplifier circuit 12 generates the output signals ONA1 and ONA2 obtained by amplifying the voltages of the input signals IN1 and IN2, and generates the output signals ONB1 and ONB2 fixed to the power supply voltage VDD level.

At this time, both of the transistors PD1 and PD2 are turned off because the respective output signals ONB1 and ONB2 fixed to the power supply voltage VDD level are applied to the gates. Further, both of the transistors NC1 and NC2 are turned on, but do not perform the differential operation because the respective output signals OPA1 and OPA2 fixed to the predetermined voltages are applied to the gates. On the contrary, the transistors PC1 and PC2 perform the differential operation because the respective differential signals ONA1 and ONA2 are applied to the gates. Further, the transistors ND1 and ND2 perform the differential operation because the respective differential signals OPB1 and OPB2 are applied to the gates. Thereby, the differential signals are output from the output terminals OUT1 and OUT2 to the outside of the synthesis circuit 13.

Next, an operation of the synthesis circuit 13 in the case where the input signals IN1 and IN2 indicate voltage values in the range between the voltage VP and the voltage VDD will be described. In this case, the differential amplifier circuit 11 generates the output signals OPA1, OPA2, OPB1, and OPB2 fixed to predetermined voltages irrespective of the input signals IN1 and IN2. Further, the differential amplifier circuit 12 generates the output signals ONA1 and ONA2 obtained by amplifying the voltages of the input signals IN1 and IN2, and generates the output signals ONB1 and ONB2 fixed to the power supply voltage VDD level.

At this time, both of the transistors PD1 and PD2 are turned off because the respective output signals ONB1 and ONB2 fixed to the power supply voltage VDD level are applied to the gates. Further, all the transistors NC1, NC2, ND1, and ND2 are turned on, but do not perform the differential operation because the respective output signals OPA1, OPA2, OPB1, and OPB2 fixed to the predetermined voltages are applied to the gates. On the contrary, the transistors PC1 and PC2 perform the differential operation because the respective differential signals ONA1 and ONA2 are applied to the gates. Thereby, the differential signals are output from the output terminals OUT1 and OUT2 to the outside of the synthesis circuit 13.

FIG. 8 is a diagram for showing a relation between the voltage range of the input signals IN1 and IN2 and the state of each pair of differential transistors provided in the synthesis circuit 13. As shown in FIG. 8, one of the pairs of differential transistors performs the differential operation in the entire voltage range of the input signals IN1 and IN2. Namely, the voltages of the input signals IN1 and IN2 are amplified in a wide range.

It should be noted that the voltage value of the constant voltage VNG and the resistance values of the resistive elements RPA11, RPA12, RPA21, and RPA22 are adjusted so that the output signals OPA1 and OPA2 indicate voltage values in the range between the ground voltage GNU and the breakdown voltage of the N-channel MOS transistor. Further, the voltage value of the constant voltage VNG and the resistance values of the resistive elements RPB1 and RPB2 are adjusted so that the output signals OPB1 and OPB2 indicate voltage values in the range between the ground voltage GND and the breakdown voltage of the N-channel MOS transistor.

Further, the voltages of the output signals ONA1 and ONA2 are adjusted so as to indicate values in the range between the power supply voltage VDD and the breakdown voltage of the P-channel MOS transistor by adjusting the voltage value of the constant voltage VPG and the resistance values of the resistive elements RNA11, RNA12, RNA21, and RNA22. The voltages of the output signals ONB1 and ONB2 are adjusted so as to indicate values in the range between the power supply voltage VDD and the breakdown voltage of the P-channel MOS transistor by adjusting the voltage value of the constant voltage VPG and the resistance values of the resistive elements RNB1 and RNB2.

Thereby, the voltage applied to each transistor provided in the synthesis circuit 13 can be set to the breakdown voltage or lower. Namely, each transistor provided in the synthesis circuit 13 can be prevented from being destroyed.

As described above, in the semiconductor device 1 according to the embodiment, the differential amplifier circuit 11 includes the first differential amplifying units PTA1 and PTA2 that perform the amplifying operation in the case where the differential input signals indicate the voltage range of GND to VH2, the second differential amplifying units PTB1 and PTB2 that perform, the amplifying operation in the case where the differential input signals indicate the second voltage range of VH2 to VP, and the protection transistors PX1, PX2, PZ1, PZ2, and the like that conduct between the source and the drain of each pair of differential transistors included in the first and second differential amplifying units in the case where the differential input signals indicate the voltage range of VP to VDD. Further, the differential amplifier circuit 12 includes the third differential amplifying units NTA1 and NTA2 that perform the amplifying operation in the case where the differential input signals indicate the voltage range of VL2 to VDD, the fourth differential amplifying units NTB1 and NTB2 that perform the amplifying operation in the case where the differential input signals indicate the voltage range of VN to VL2 and the protection transistors NX1, NX2, NZ1, NZ2, and the like that conduct between the source and the drain of each pair of differential transistors included in the third and fourth differential amplifying units in the case where the differential input signals indicate the voltage range of GND to VN.

Thereby, the semiconductor device 1 according to the embodiment can amplify the differential input signals of various interface standards across a wide range. Here, in the case where there is a risk that a voltage exceeding the breakdown voltage is applied to each pair of differential transistors in the semiconductor device 1 according to the embodiment, the voltage applied to each pair of differential transistors can be suppressed to the breakdown voltage or lower by conducting between the source and the drain of each pair of differential transistors using the protection transistors such as the transistors PX1 and PZ1. It should be noted that it is only necessary for each of the transistors PX1, PZ1, and the like to suppress the voltage applied to each pair of differential transistors to the breakdown voltages or lower. Thus, each of the transistors PX1, PZ1, and the like may be configured in such a manner that the W/L ratio (W: channel width and L: channel length) thereof is lower than that of each pair of differential transistors.

(Comparison Between the Configuration of Japanese Unexamined Patent Application Publication No. 2004-289282 and the Configuration of the Embodiment)

A differential input circuit disclosed in Japanese Unexamined Patent Application Publication No. 2004-289282 includes a bias circuit, first and second clamp circuits, and a loopback cascode amplifier circuit.

The bias circuit generates bias voltages BIAS1 to BIAS4. It should be noted that a relation of BIAS1<BIAS2<BIAS3<BIAS4 is satisfied. The first and second clamp circuits generate signals INL+ and INL− in the voltage range of GND to BIAS3 from differential input signals IN+ and IN− in the voltage range of GND to VDD, and generate signals INH+ and INH− in the voltage range of BIAS2 to VDD. The loopback cascode amplifier circuit outputs differential output signals OUT+ and OUT− from the respective outputs of the first and second clamp circuits.

More specifically, the loopback cascode amplifier circuit has a first input unit including a pair of N-channel differential transistors in which the signals INL+ and INL− are applied to the gates, a second input unit including a pair of P-channel differential transistors in which the signals INH+ and INH− are applied to the gates, and a loopback cascode amplifying unit that performs the amplifying operation on the basis of the output results of the first and second input units.

Figure 13:
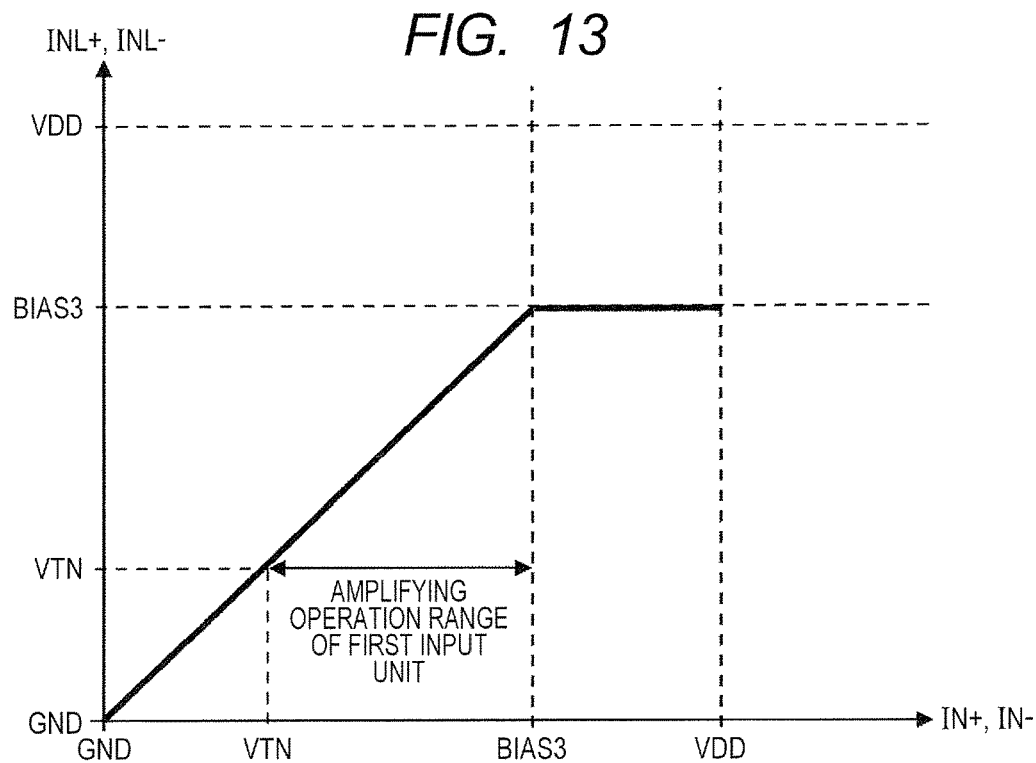
FIG. 13 is a diagram for explaining a problem of a configuration disclosed in Japanese Unexamined Patent Application Publication No. 2004-289282.
Figure 14:
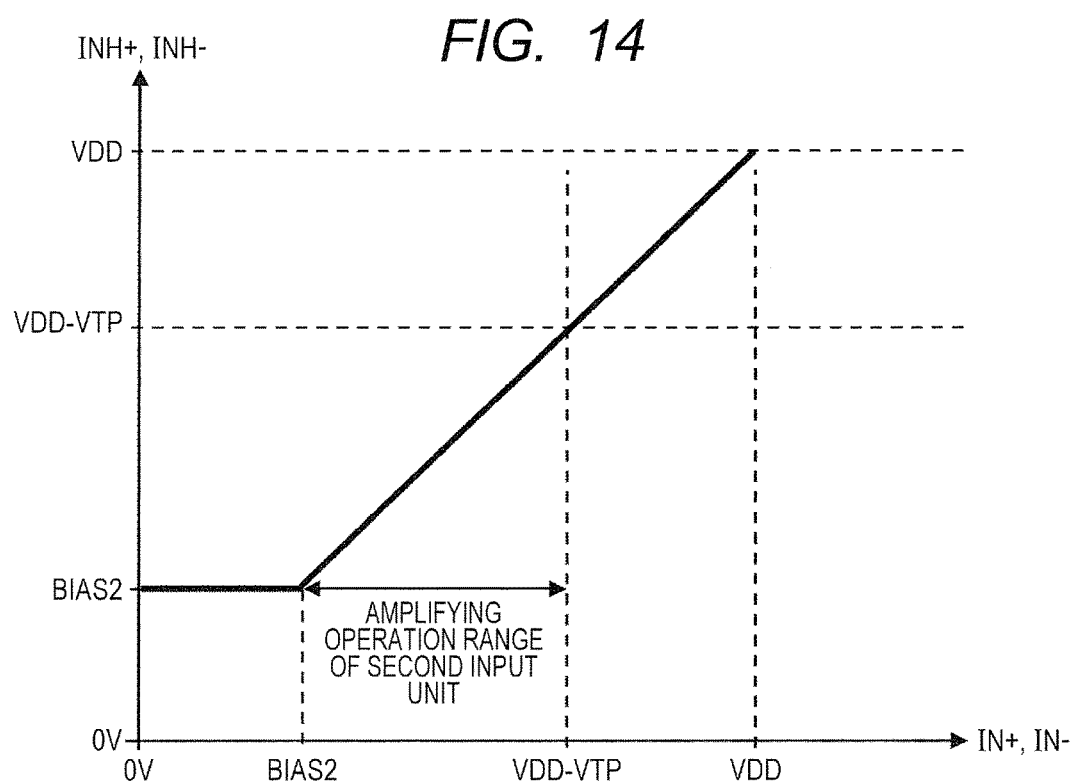
FIG. 14 is a diagram for explaining a problem of the configuration disclosed in Japanese Unexamined Patent Application Publication No. 2004-289282.

Here, as shown in FIG. 13, the pair of differential transistors of the first input unit can perform the amplifying operation only for the range between the voltage VTN and the voltage BIAS3 of the signals INL+ and INL− in the voltage range of GND to BIAS3. It should be noted that VTN represents the threshold voltage of the N-channel MOS transistor. Further, as shown in FIG. 14, the pair of differential transistors of the second input unit, can perform the amplifying operation only for the range between the voltage BIAS2 and the voltage VDD-VTP of the signals INH+ and INH− in the voltage range of BIAS2 to VDD. It should be noted that VTP represents the threshold voltage of the P-channel MOS transistor. Namely, even if the first input unit and the second input unit are combined to each other, the amplifying operation can be performed only for the range between the voltage VTN and the voltage VDD-VTP of the differential input. signals IN+ and IN− in the voltage range of GND to VDD. In other words, the differential input, circuit cannot amplify the differential input signals IN+ and IN− across a wide range.

On the contrary, the semiconductor device 1 according to the embodiment can amplify the differential input signals of various interface standards across a wide range unlike the configuration disclosed in Japanese Unexamined Patent Application Publication No. 2004-289282.

Second Embodiment

Figure 9:
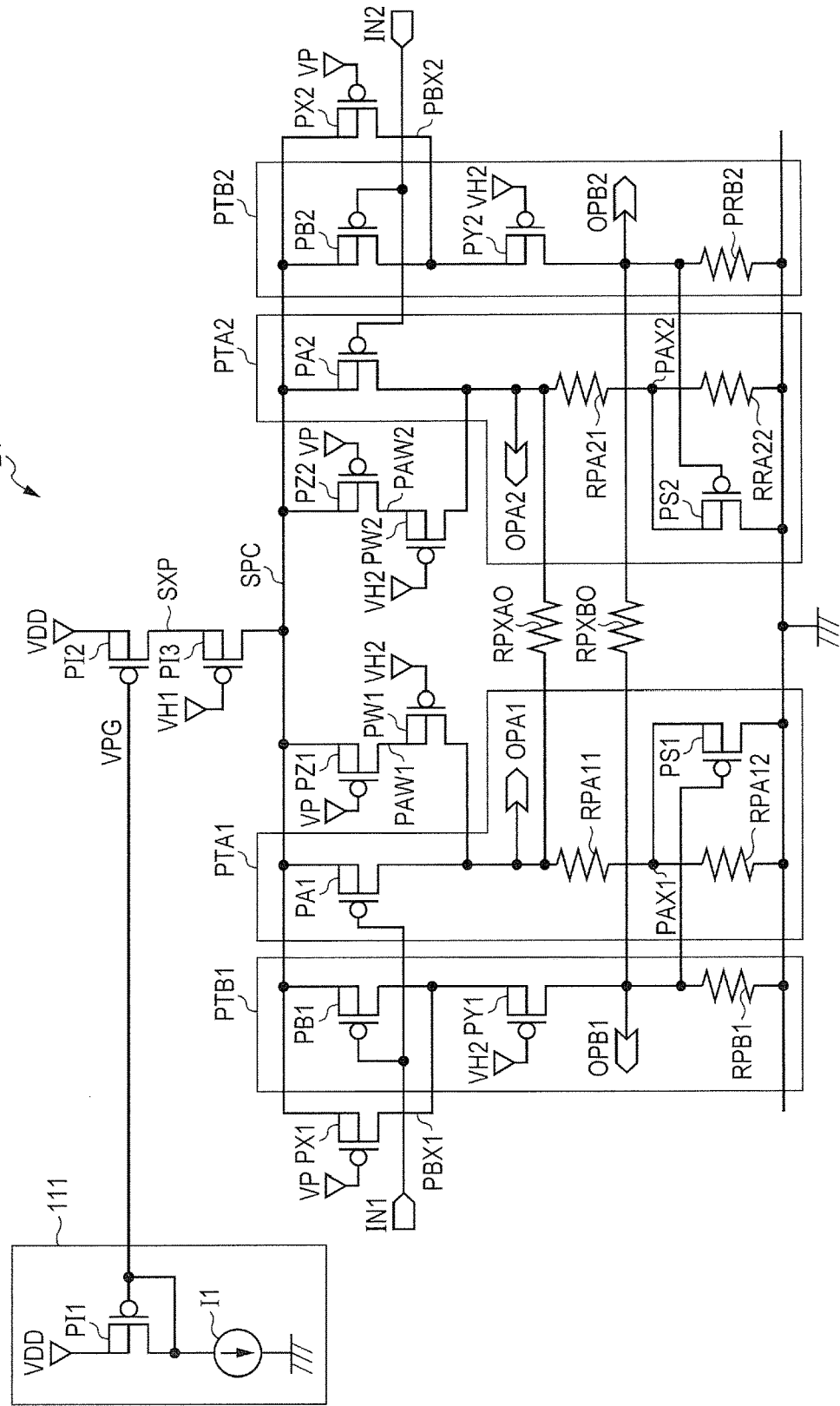
FIG. 9 is a circuit diagram for showing a configuration example of a P-channel differential amplifier circuit provided in a semiconductor device according to a second embodiment.
Figure 10:
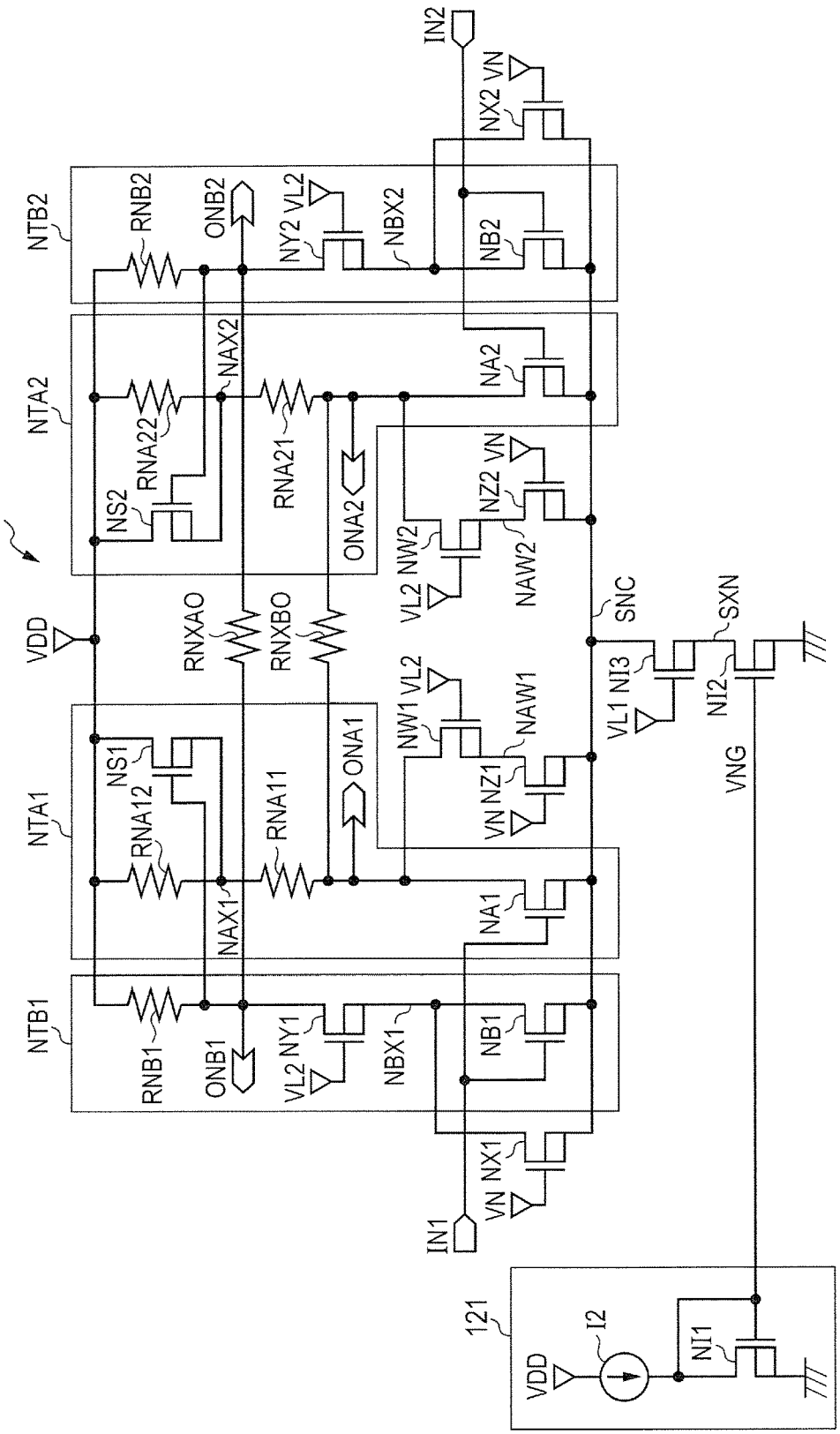
FIG. 10 is a circuit diagram for showing a configuration example of an N-channel differential amplifier circuit provided in the semiconductor device according to the second embodiment.

FIG. 9 is a circuit diagram, for showing a configuration example of a differential amplifier circuit 21 provided in a semiconductor device 2 according to a second embodiment. FIG. 10 is a circuit diagram for showing a configuration example of a differential amplifier circuit 22 provided in the semiconductor device 2 according to the second embodiment. The differential amplifier circuits 21 and 22 correspond to the differential amplifier circuits 11 and 12 in the semiconductor device 1, respectively. The other configurations of the semiconductor device 2 are the same as those of the semiconductor device 1, and thus the explanation thereof will be omitted.

First, as shown in FIG. 9, the differential amplifier circuit 21 further includes a resistive element RPXA0 provided between the output terminals OPA1 and OPA2 and a resistive element RPXB0 provided between the output terminals OPB1 and OPB2 as compared to the differential amplifier circuit 11. The other configurations of the differential amplifier circuit 21 are the same as those of the differential amplifier circuit 11, and thus the explanation thereof will be omitted.

Further, as shown in FIG. 10, the differential amplifier circuit 22 further includes a resistive element RNXA0 provided between the output terminals ONA1 and ONA2 and a resistive element RNXB0 provided between the output terminals ONB1 and ONB2 as compared to the differential amplifier circuit 12. The other configurations of the differential amplifier circuit 22 are the same as those of the differential amplifier circuit 12, and thus the explanation thereof will be omitted.

As described above, the semiconductor device 2 can suppress variation of the amplitude of the differential output signal output from each differential output terminal by providing the resistive element between the differential output terminals of the differential amplifier circuit 21. Likewise, the semiconductor device 2 can suppress variation of the amplitude of the differential output signal output from each differential output terminal by providing the resistive element between the differential output terminals of the differential amplifier circuit 22.

Third Embodiment

Figure 11:
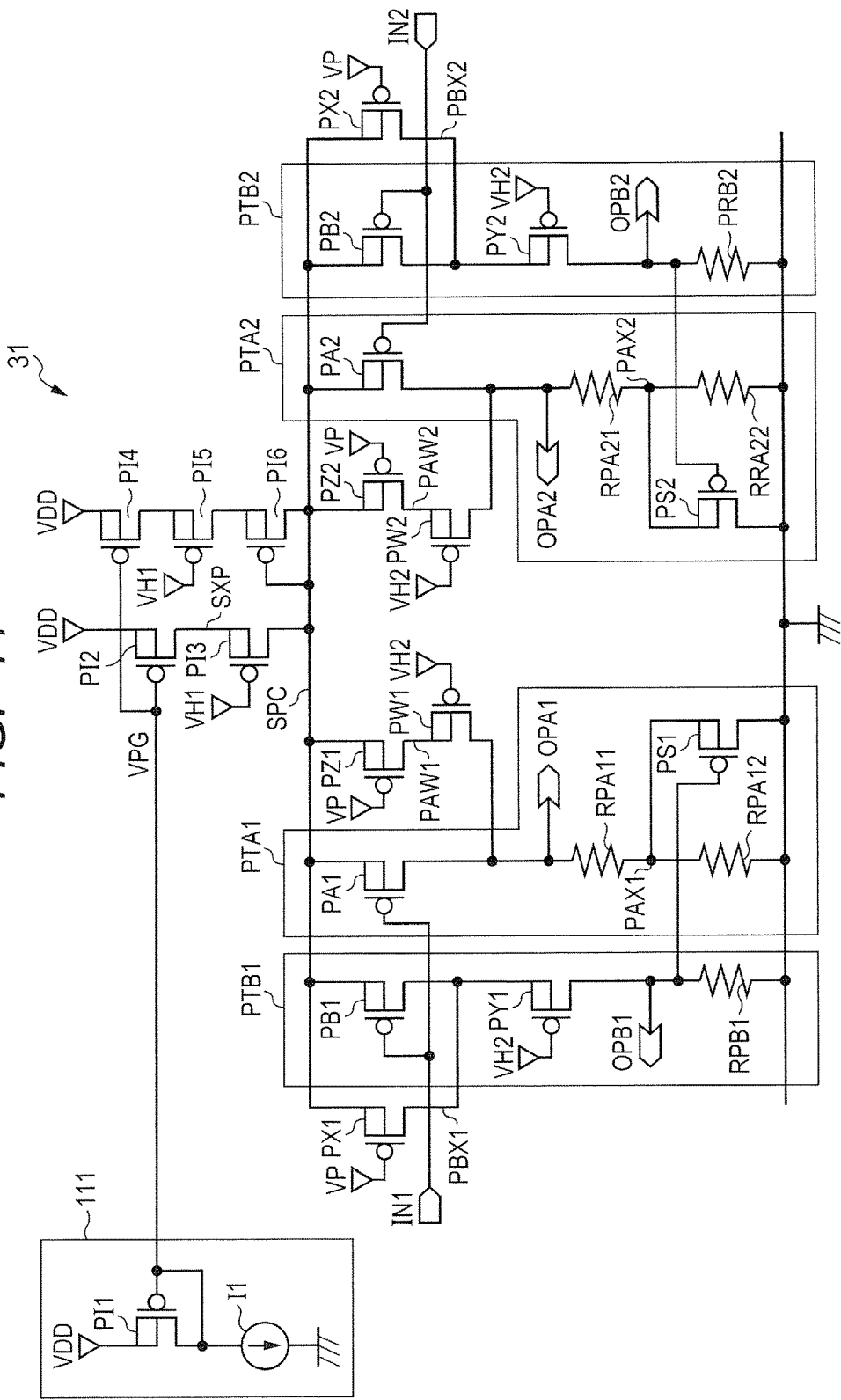
FIG. 11 is a circuit diagram for showing a configuration example of a P-channel differential amplifier circuit provided in a semiconductor device according to a third embodiment.
Figure 12:
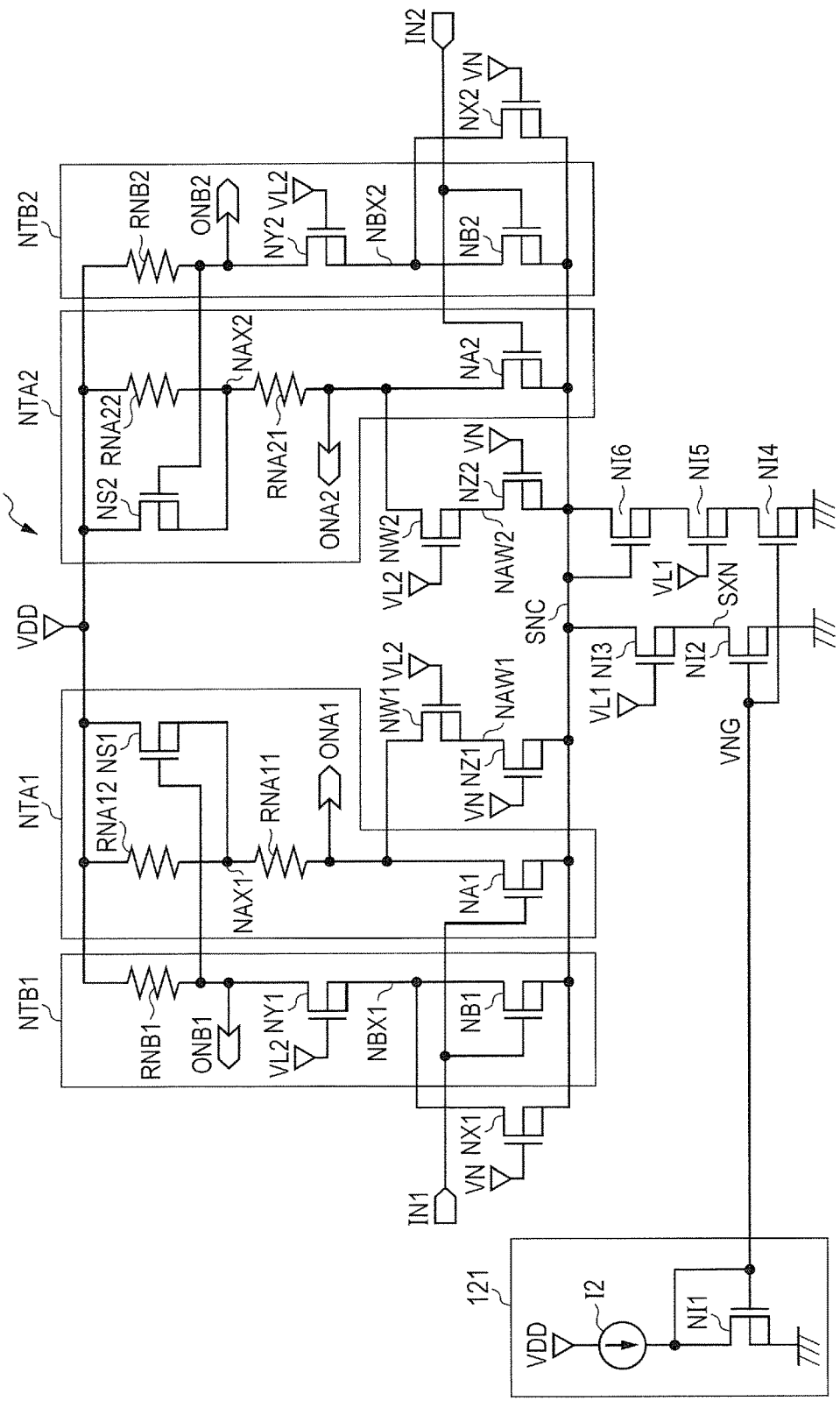
FIG. 12 is a circuit diagram for showing a configuration example of an N-channel differential amplifier circuit provided in the semiconductor device according to the third embodiment.

FIG. 11 is a circuit diagram for showing a configuration example of a differential amplifier circuit 31 provided in a semiconductor device 3 according to a third embodiment. FIG. 12 is a circuit diagram for showing a configuration example of a differential amplifier circuit 32 provided in the semiconductor device 3 according to the third embodiment. The differential amplifier circuits 31 and 32 correspond to the differential amplifier circuits 11 and 12 in the semiconductor device 1, respectively. The other configurations of the semiconductor device 3 are the same as those of the semiconductor device 1, and thus the explanation thereof will be omitted.

First, as shown in FIG. 11, the differential amplifier circuit 31 further includes a constant current circuit configured using P-channel MOS transistors (hereinafter, simply referred to as transistors) PI4 to PI5 as compared to the differential amplifier circuit 11. The transistors PI4 to PI6 are provided in series between the power supply voltage terminal VDD and the node SPC, and the constant voltage VPG, the voltage VH1, and the voltage of the node SPC are applied to the respective gates thereof o The other configurations of the differential amplifier circuit 31 are the same as those of the differential amplifier circuit 11, and thus the explanation thereof will be omitted.

Further, as shown in FIG. 12, the differential amplifier circuit 32 farther includes a constant current circuit configured using N-channel MOS transistors (hereinafter, simply referred to as transistors) NI4 to NI5 as compared to the differential amplifier circuit 12. The transistors NI4 to NI6 are provided in series between the ground voltage terminal GND and the node SNC, and the constant voltage VNG, the voltage VL1, and the voltage of the node SNC are applied to the respective gates thereof. The other configurations of the differential amplifier circuit 32 are the same as those of the differential amplifier circuit 12, and thus the explanation thereof will be omitted.

In the differential amplifier circuit 11, the amplitudes of the differential output signals OPA1 and OPA2 occur at low potential, and thus the voltage between the drain and the source of each of the transistors PA1 and PA2 is likely to increase. As a result, there is a possibility that the amplitudes of the differential output signals OPA1 and OPA2 become smaller than those of the differential output signals OPB1 and OPB2 due to the short channel effect. Accordingly, in the differential amplifier circuit 31, when the differential amplifying operation is performed by the first differential amplifying units PTA1 and PTA2, that is, when the voltages of the input signals IN1 and IN2 are equal to or lower than the voltage VH2 and the voltage of the node SPC is lowered, the constant current supplied to the node SPC is increased by switching the transistor PI6 from on to off. Thereby, a difference between the currents flowing in the transistors PA1 and PA2 becomes large, and thus the amplitudes of the differential output signals OPA1 and OPA2 can be made large.

In the differential amplifier circuit 12, the amplitudes of the differential output signals ONA1 and ONA2 occur at high potential, and thus the voltage between the drain and the source of each of the transistors NA1 and NA2 is likely to increase. As a result, there is a possibility that the amplitudes of the differential output signals ONA1 and ONA2 become smaller than those of the differential output signals ONB1 and ONB2 due to the short channel effect. Accordingly, in the differential amplifier circuit 32, when the differential amplifying operation is performed by the first differential amplifying units NTA1 and NTA2, that is, when the voltages of the input signals IN1 and IN2 are equal to or higher than the voltage VL2 and the voltage of the node SNC rises, the constant current supplied from the node SNC to the ground voltage terminal GND is increased by switching the transistor NI6 from off to on. Thereby, a difference between the currents flowing in the transistors NA1 and NA2 becomes large, and thus the amplitudes of the differential output signals ONA1 and ONA2 can be made large.

It should be noted that the configuration of the constant current circuit is not limited to the above-described configuration, but can be appropriately changed to other configurations having the same function.

As described above, in the semiconductor devices according to the first to third embodiments, the P-channel differential amplifier circuits (11, 21, and 31) include the first differential amplifying units PTA1 and PTA2 that perform the amplifying operation in the case where the differential input signals indicate the voltage range of GND to VH2, the second differential amplifying units PTB1 and PTB2 that perform the amplifying operation in the case where the differential input signals indicate the second voltage range of VH2 to VP, and the protection transistors PX1, PX2, PZ1, PZ2, and the like that conduct between the source and the drain of each pair of differential transistors included in the first and second differential amplifying units in the case where the differential input signals indicate the voltage range of VP to VDD. Further, the differential amplifier circuit 12 includes the third differential amplifying units NTA1 and NTA2 that perform the amplifying operation in the case where the differential input signals indicate the voltage range of VL2 to VDD, the fourth differential amplifying units NTB1 and NTB2 that perform the amplifying operation in the case where the differential input signals indicate the voltage range of VN to VL2, and the protection transistors NX1 NX2, NZ1, NZ2, and the like that conduct between the source and the drain of each pair of differential transistors included in the third and fourth differential amplifying units in the case where the differential input signals indicate the voltage range of GND to VN.

Thereby, the semiconductor devices according to the first to third embodiments can amplify the differential input signals of various interface standards across a wide range. Here, in the case where there is a risk that a voltage exceeding the breakdown voltage is applied to each pair of differential transistors in the semiconductor devices according to the first to third embodiments, the voltage applied to each pair of differential transistors can be suppressed to the breakdown voltage or lower by conducting between the source and the drain of each pair of differential transistors using the protection transistors such as the transistors PX1 and PZ1.

The invention achieved by the inventors has been concretely described above on the basis of the embodiments. However, it is obvious that the present invention is not limited to the above-described embodiments, but can be variously changed without departing from the scope of the invention.

For example, the semiconductor devices according to the above-described embodiments may be configured in such a manner that the conductive type (p-type or n-type) of the semiconductor substrate, the semiconductor layer, the diffusion layer (diffusion area), and the like is inverted. Therefore, in the case where one conductive type of the n-type and p-type is assumed as a first conductive type and the other conductive type is assumed as a second conductive type, the first conductive type can be the p-type, and the second conductive type can be the n-type. On the contrary, the first conductive type can be the n-type, and the second conductive type can be the p-type.

What is claimed is:

1. A semiconductor device comprising:
   a first differential amplifying unit that includes a first pair of P-channel differential transistors in which one and the other of differential input signals are applied to the respective gates and the voltage of a first node changed in accordance with the voltage range of the differential input signals is applied to each source, and that amplifies the differential input signals in the case where the differential input signals indicate a first voltage range;
   a second differential amplifying unit that includes a second pair of P-channel differential transistors in which one and the other of the differential input signals are applied to the respective gates and the voltage of the first node is applied to each source, and that amplifies the differential input signals in the case where the differential input signals indicate a second voltage range higher than the first voltage range;
   a first protection unit that conducts between each source and each drain of the first and second pairs of differential transistors in the case where the differential input signals indicate a third voltage range higher than the first and second voltage ranges;
   a third differential amplifying unit that includes a third pair of N-channel differential transistors in which one and the other of the differential input signals are applied to the respective gates and the voltage of a second node changed in accordance with the voltage range of the differential input signals is applied to each source, and that amplifies the differential input signals in the case where the differential input signals indicate a fourth voltage range;
   a fourth differential amplifying unit that includes a fourth pair of N-channel differential transistors in which one and the other of the differential input signals are applied to the respective gates and the voltage of the second node is applied to each source, and that amplifies the differential input signals in the case where the differential input signals indicate a fifth voltage range lower than the fourth voltage range;
   a second protection unit that conducts between each source and each drain of the third and fourth pairs of differential transistors in the case where the differential input signals indicate a sixth voltage range lower than the fourth and fifth voltage ranges; and
   a synthesis circuit that generates differential output signals by synthesizing amplification results obtained by the first to fourth differential amplifying units.

2. The semiconductor device according to claim 1, wherein the second differential amplifying unit includes:
   a first resistive element that is provided in series to one of the second pair of differential transistors;
   a first P-channel clamp transistor that is provided between one of the second pair of differential transistors and the first resistive element and in which a boundary voltage between the first and second voltage ranges is applied to the gate;

a second resistive element that is provided in series to the other of the second pair of differential transistors; and
a second P-channel clamp transistor that is provided between the other of the second pair of differential transistors and the second resistive element and in which the boundary voltage between the first and second voltage ranges is applied to the gate,
wherein each output voltage of the first and second resistive elements is output as a differential output signal of the second differential amplifying unit,
wherein the fourth differential amplifying unit includes:
a third resistive element that is provided in series to one of the fourth pair of differential transistors;
a third N-channel clamp transistor that is provided between one of the fourth pair of differential transistors and the third resistive element and in which a boundary voltage between the fourth and fifth voltage ranges is applied to the gate;
a fourth resistive element that is provided in series to the other of the fourth pair of differential transistors; and
a fourth N-channel clamp transistor that is provided between the other of the fourth pair of differential transistors and the fourth resistive element and in which the boundary voltage between the fourth and fifth voltage ranges is applied to the gate, and
wherein a voltage generated by each of the third. and fourth resistive elements is output as a differential output signal of the fourth differential amplifying unit.

3. The semiconductor device according to claim 2,
wherein the first differential amplifying unit includes:
fifth and sixth resistive elements that are provided in series to one of the first pair of differential transistors;
a first auxiliary transistor that is provided in parallel with the sixth resistive element and on/off of which is controlled on the basis of the output voltage of the first resistive element that is one output of the second differential amplifying unit;
seventh and eighth resistive elements that are provided in series to the other of the first pair of differential transistors; and
a second auxiliary transistor that is provided in parallel with the eighth resistive element and on/off of which is controlled on the basis of the output voltage of the second resistive element that is the other output of the second differential amplifying unit,
wherein each drain voltage of one and the other of the first pair of differential transistors is output as a differential output signal of the first differential amplifying unit,
wherein the third differential amplifying unit includes:
ninth and tenth resistive elements that are provided in series to one of the third pair of differential transistors;
a third auxiliary transistor that is provided in parallel with the tenth resistive element and on/off of which is controlled on the basis of the output voltage of the third resistive element that is one output of the fourth differential amplifying unit;
eleventh and twelfth resistive elements that are provided in series to the other of the third pair of differential transistors; and
a fourth auxiliary transistor that is provided in parallel with the twelfth resistive element and on/off of which is controlled on the basis of the output voltage of the fourth resistive element that is the other output of the fourth differential amplifying unit, and
wherein each drain voltage of one and the other of the third pair of differential transistors is output as a differential output signal of the third differential amplifying unit.

4. The semiconductor device according to claim 3,
wherein the sixth resistive element is configured to indicate a resistance value higher than that of the fifth resistive element,
wherein the eighth resistive element is configured to indicate a resistance value higher than that of the seventh resistive element,
wherein the tenth resistive element is configured to indicate a resistance value higher than that of the ninth resistive element, and
wherein the twelfth resistive element is configured to indicate a resistance value higher than that. of the eleventh resistive element.

5. The semiconductor device according to claim 1,
wherein the first protection unit includes at least:
a first protection transistor that is provided in parallel with one of the second pair of differential transistors and that is turned on in the case where the differential input signals indicate the third voltage range; and
a second protection transistor that is provided in parallel with the other of the second pair of differential transistors and that is turned on in the case where the differential input signals indicate the third voltage range, and
wherein the second protection unit includes at least:
a third protection transistor that is provided in parallel with one of the fourth pair of differential transistors and that is turned on in the case where the differential input signals indicate the sixth voltage range; and
a fourth protection transistor that is provided in parallel with the other of the fourth pair of differential transistors and that is turned on in the case where the differential input signals indicate the sixth voltage range.

6. The semiconductor device according to claim 1,
wherein the first protection unit includes at least:
a fifth protection transistor that is provided in parallel with one of the first pair of differential transistors and that is turned on an the case where the differential input signals indicate the third voltage range;
a fifth P-channel clamp transistor that is provided in series to the fifth protection transistor and in which the boundary voltage between the first and second voltage ranges is applied to the gate;
a sixth protection transistor that is provided in parallel with the other of the first pair of differential transistors and that is turned on in the case where the differential input signals indicate the third voltage range; and
a sixth P-channel clamp transistor that is provided in series to the sixth protection transistor and in which the boundary voltage between the first and second voltage ranges is applied to the gate, and
wherein the second protection unit includes at least:
a seventh protection transistor that is provided in parallel with one of the third pair of differential transistors and that is turned on in the case where the differential input signals indicate the sixth voltage range;
a seventh N-channel clamp transistor that is provided in series to the seventh protection transistor and in which the boundary voltage between the fourth and fifth voltage ranges is applied to the gate;
an eighth protection transistor that is provided in parallel with the other of the third pair of differential transistors and that is turned on in the case where the differential input signals indicate the sixth voltage range; and an eighth N-channel clamp transistor that is provided in series to the eighth protection transistor and in which the boundary voltage between the fourth and fifth voltage ranges is applied to the gate.

7. The semiconductor device according to claim 1, wherein the first protection unit includes:

a first protection transistor that is provided in parallel with one of the second pair of differential transistors and that is turned on in the case where the differential input signals indicate the third voltage range;

a second protection transistor that is provided in parallel with the other of the second pair of differential transistors and that is turned on in the case where the differential input signals indicate the third voltage range;

a fifth protection transistor that is provided in parallel with one of the first pair of differential transistors and that is turned on in the case where the differential input signals indicate the third voltage range;

a fifth P-channel clamp transistor that is provided in series to the fifth protection transistor and in which the boundary voltage between the first and second voltage ranges is applied to the gate;

a sixth protection transistor that is provided in parallel with the other of the first pair of differential transistors and that is turned on in the case where the differential input signals indicate the third voltage range; and a sixth P-channel clamp transistor that is provided in series to the sixth protection transistor and in which the boundary voltage between the first and second voltage ranges is applied to the gate, and wherein the second protection unit includes a third protection transistor that is provided in parallel with one of the fourth pair of differential transistors and that is turned on in the case where the differential input signals indicate the sixth voltage range;

a fourth protection transistor that is provided in parallel with the other of the fourth pair of differential transistors and that is turned on in the case where the differential input signals indicate the sixth voltage range;

a seventh protection transistor that is provided in parallel with one of the third pair of differential transistors and that is turned on in the case where the differential input signals indicate the sixth voltage range;

a seventh N-channel clamp transistor that is provided in series to the seventh protection transistor and in which the boundary voltage between the fourth and fifth voltage ranges is applied to the gate;

an eighth protection transistor that is provided in parallel with the other of the third pair of differential transistors and that is turned on in the case where the differential input signals indicate the sixth voltage range; and an eighth N-channel clamp transistor that is provided in series to the eighth protection transistor and in which the boundary voltage between the fourth and fifth voltage ranges is applied to the gate.

8. The semiconductor device according to claim 1, further comprising:

a first constant current circuit that allows a constant current to flow in the first node; and a second constant current circuit that allows a constant current to flow in the second node.

9. The semiconductor device according to claim 8, further comprising:

a first additional current supply circuit that allows an additional constant current to flow in the first node;

a first switch that is provided between the first node and the first additional current supply circuit and that is turned on in the case where the differential input signals indicate the first voltage range;

a second additional current supply circuit that allows an additional constant current to flow in the second node; and a second switch that is provided between the second node and the second additional current supply circuit and that is turned on in the case where the differential input signals indicate the fourth voltage range.

10. The semiconductor device according to claim 1, further comprising:

a thirteenth resistive element that is provided between the output terminals of the first differential amplifying unit;

a fourteenth resistive element that is provided between the output terminals of the second differential amplifying unit;

a fifteenth resistive element that is provided between the output terminals of the third differential amplifying unity and a sixteenth resistive element that is provided between the output terminals of the fourth differential amplifying unit.

* * * * *